United States Patent
Prasad et al.

(10) Patent No.: US 10,957,711 B2
(45) Date of Patent: Mar. 23, 2021

(54) FERROELECTRIC DEVICE WITH MULTIPLE POLARIZATION STATES AND METHOD OF MAKING THE SAME

(71) Applicant: SANDISK TECHNOLOGIES LLC, Addison, TX (US)

(72) Inventors: Bhagwati Prasad, San Jose, CA (US); Alan Kalitsov, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/778,245

(22) Filed: Jan. 31, 2020

(65) Prior Publication Data
US 2020/0203380 A1    Jun. 25, 2020

Related U.S. Application Data

(63) Continuation of application No. 16/227,889, filed on Dec. 20, 2018, now Pat. No. 10,700,093.

(51) Int. Cl.
| | |
|---|---|
| *G11C 11/22* | (2006.01) |
| *H01L 27/11585* | (2017.01) |
| *H01L 21/28* | (2006.01) |
| *H01L 29/417* | (2006.01) |
| *H01L 29/51* | (2006.01) |
| *H01L 29/778* | (2006.01) |

(52) U.S. Cl.
CPC .... *H01L 27/11585* (2013.01); *G11C 11/2273* (2013.01); *G11C 11/2275* (2013.01); *H01L 29/40111* (2019.08); *H01L 29/41725* (2013.01); *H01L 29/516* (2013.01); *H01L 29/778* (2013.01)

(58) Field of Classification Search
CPC ......... H01L 27/11585; H01L 29/40111; H01L 29/41725; H01L 29/516; H01L 29/778; H01L 27/1159; H01L 29/78391; H01L 29/1606; G11C 11/2273; G11C 11/2275; G11C 11/54; G11C 11/223
See application file for complete search history.

(56) References Cited

U.S. PATENT DOCUMENTS

| | | |
|---|---|---|
| 5,198,994 A | 3/1993 | Natori |
| 9,721,963 B1 | 8/2017 | Rabkin et al. |
| 9,941,299 B1 | 4/2018 | Chen et al. |

(Continued)

FOREIGN PATENT DOCUMENTS

| | | |
|---|---|---|
| EP | 3128534 | 2/2017 |
| JP | 2006210525 | 8/2006 |

(Continued)

OTHER PUBLICATIONS

Zheng et al., "Gate-controlled Non-Volatile Graphene-ferroelectric Memory," Appl. Phys. Lett. 94, 163505 (2009).

(Continued)

*Primary Examiner* — Gene N Auduong
(74) *Attorney, Agent, or Firm* — The Marbury Law Group, PLLC

(57) ABSTRACT

A ferroelectric device includes a semiconductor channel region, a gate electrode, and a ferroelectric gate dielectric located between the channel region and the gate electrode, and including a plurality of ferroelectric gate dielectric portions having different structural defect densities.

19 Claims, 29 Drawing Sheets

(56) References Cited

U.S. PATENT DOCUMENTS

| | | | |
|---|---|---|---|
| 10,403,753 | B2 | 9/2019 | Jonker et al. |
| 10,700,093 | B1 | 6/2020 | Kalitsov et al. |
| 10,720,437 | B2* | 7/2020 | Yoo .................... G11C 11/5657 |
| 2001/0048622 | A1 | 12/2001 | Kwon et al. |
| 2003/0053350 | A1 | 3/2003 | Krieger et al. |
| 2003/0155602 | A1 | 8/2003 | Krieger et al. |
| 2003/0178667 | A1 | 9/2003 | Krieger et al. |
| 2003/0179633 | A1 | 9/2003 | Krieger et al. |
| 2004/0026729 | A9 | 2/2004 | Krieger et al. |
| 2004/0159835 | A1 | 8/2004 | Krieger et al. |
| 2005/0151177 | A1 | 7/2005 | Miyazawa et al. |
| 2007/0020803 | A1 | 1/2007 | Saigoh et al. |
| 2009/0026513 | A1 | 1/2009 | Johansson et al. |
| 2010/0144064 | A1 | 6/2010 | Saigoh et al. |
| 2012/0104325 | A1 | 5/2012 | Talapin et al. |
| 2014/0098458 | A1 | 4/2014 | Almadhoun et al. |
| 2015/0372225 | A1 | 12/2015 | Gaidis et al. |
| 2016/0172365 | A1 | 6/2016 | McKinnon et al. |
| 2016/0240545 | A1 | 8/2016 | Karda et al. |
| 2016/0276579 | A1 | 9/2016 | Gaidis et al. |
| 2016/0308107 | A1 | 10/2016 | Talapin et al. |
| 2017/0114241 | A1 | 4/2017 | Almadhoun et al. |
| 2017/0316713 | A1 | 11/2017 | Hyman |
| 2018/0158934 | A1 | 6/2018 | Jonker et al. |
| 2018/0158955 | A1 | 6/2018 | Jonker et al. |
| 2018/0323214 | A1 | 11/2018 | Karda et al. |
| 2018/0358380 | A1 | 12/2018 | Yoo |
| 2018/0374929 | A1 | 12/2018 | Yoo |
| 2019/0019800 | A1 | 1/2019 | Yoo et al. |
| 2019/0108998 | A1 | 4/2019 | Mueller-Meskamp et al. |
| 2019/0244973 | A1 | 8/2019 | Yoo |
| 2019/0288116 | A1* | 9/2019 | Yoo ........................ H01L 29/516 |
| 2019/0348530 | A1* | 11/2019 | Ando ..................... H01L 29/775 |
| 2019/0393355 | A1 | 12/2019 | Yoo et al. |
| 2020/0091306 | A1 | 3/2020 | Heo et al. |
| 2020/0203380 | A1 | 6/2020 | Prasad et al. |

FOREIGN PATENT DOCUMENTS

| | | |
|---|---|---|
| KR | 10-20140041123 A | 4/2014 |
| KR | 10-20180134122 A | 12/2018 |
| WO | WO2016-200742 A1 | 12/2016 |
| WO | 2018094397 A1 | 5/2018 |

OTHER PUBLICATIONS

Song et al., "Robust bi-stable Memory Operation in Single-layer Graphene Ferroelectric Memory," Appl. Phys. Lett. 99, 042109 (2011).

Zheng et al., "Graphene Field Effect Transistors with Ferroelectric Gating," Phys. Rev. Lett. 105, 166602 (2010).

Cadore et al., "Thermo Activated Hysteresis on High Quality Graphene/h-BN Devices," Nano Lett. 14, 5437 (2014).

Ahn et al., "Energy-Efficient Phase-Change Memory with Graphene as a Thermal Barrier," Nano Letters, 15, 6809 (2015).

Huang et al., "Graphene/Si CMOS Hybrid Hall Integrated Circuits," Science Reports, 4, 5548 (2014).

Ismach et al., "Direct Chemical Vapor Deposition of Graphene on Dielectric Surfaces," Nano Letters, 10, 1542 (2010).

Miro et al., "An Atlas of Two-Dimensional Materials," Chem. Soc. Rev., 2014,43, 6537-6554.

Notification of Transmittal of the International Search Report and Written Opinion of the International Search Authority for International Patent Application No. PCT/US2019/046717, dated Nov. 17, 2019, 11 pages.

Saremi, S. et al., "Electronic Transport and Ferroelectric Switching in Ion-Bombarded, Defect-Engineered $BiFeO_3$ Thin Films," *Adv. Mater. Interfaces* 2018, vol. 5, 1700991, (2018).

Chiu, Y.C. el al., "Multilevel nonvolatile transistor memories using a star-shaped poly((4-diphenylamino)benzyl methacrylate) gate electret," NPG Asia Materials (2013), vol. 5, e35; doi:10.1038/am.2012.64, available at https://www.nature.com/articles/am201264.

Jerry, M. et al., "Ferroelectric FET Analog Synapse for Acceleration of Deep Neural Network Training," *Tech. Dig.—Int. Electron Devices Meeting (IEDM), IEEE*, San Francisco, CA 2017, pp. 6.2.1-6.2.4, IEDM17-139 (Published—Jan. 23, 2018).

Saremi S. et al., "Local Control of Defects and Switching Properties in Ferroelectric Thin Films," Phys. Rev. Mater., vol. 2, 084414 (2018).

Wu, W. et al., "High Mobility and High on/Off Ratio Field-Effect Transistors Based on Chemical Vapor Deposited Single-Crystal $MoS_2$ Grains," Appl. Phys. Lett., vol. 102, 142106 (2013); https://doi.org/10.1063/1.4804881.

U.S. Appl. No. 16/227,889, filed Dec. 20, 2018, SanDisk Technologies LLC.
U.S. Appl. No. 16/249,300, filed Jan. 16, 2019, SanDisk Technologies LLC.
U.S. Appl. No. 16/291,673, filed Mar. 4, 2019, SanDisk Technologies LLC.
U.S. Appl. No. 16/412,764, filed May 15, 2019, SanDisk Technologies LLC.
U.S. Appl. No. 16/454,458, filed Jun. 27, 2019, SanDisk Technologies LLC.
U.S. Appl. No. 16/454,475, filed Jun. 27, 2019, SanDisk Technologies LLC.
U.S. Appl. No. 16/456,736, filed Jun. 28, 2019, SanDisk Technologies LLC.
U.S. Appl. No. 16/457,687, filed Jun. 28, 2019, SanDisk Technologies LLC.
U.S. Appl. No. 16/457,721, filed Jun. 28, 2019, SanDisk Technologies LLC.
U.S. Appl. No. 16/530,256, filed Aug. 2, 2019, SanDisk Technologies LLC.
U.S. Appl. No. 16/541,289, filed Aug. 15, 2019, SanDisk Technologies LLC.
U.S. Appl. No. 16/568,668, filed Sep. 12, 2019, SanDisk Technologies LLC.
U.S. Appl. No. 16/577,176, filed Sep. 20, 2019, SanDisk Technologies LLC.
U.S. Appl. No. 16/737,088, filed Jan. 8, 2020, SanDisk Technologies LLC.
U.S. Appl. No. 16/738,644, filed Jan. 9, 2020, SanDisk Technologies LLC.

USPTO Office Communication, Non-Final Office Action for U.S. Appl. No. 16/886,179, dated Oct. 7, 2020, 12 pages.

Notification of Transmittal of the International Search Report and Written Opinion of the International Search Authority or International Patent Application No. PCT/US2020/035742, dated Sep. 22, 2020, 11 pages.

Notification of Transmittal of the International Search Report and Written Opinion of the International Search Authority for International Patent Application No. PCT/US2020/039003, dated Nov. 19, 2020, 13 pages.

* cited by examiner

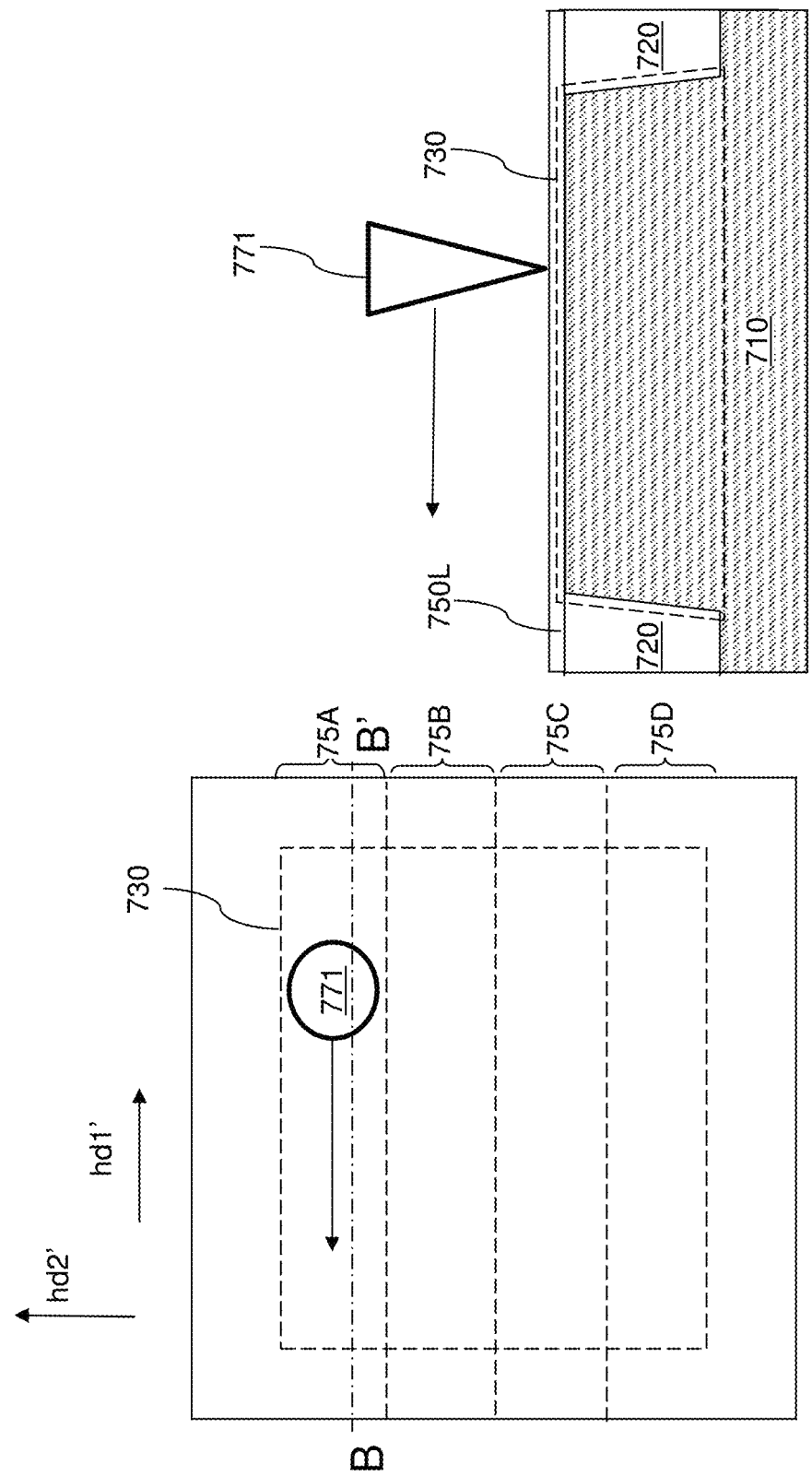

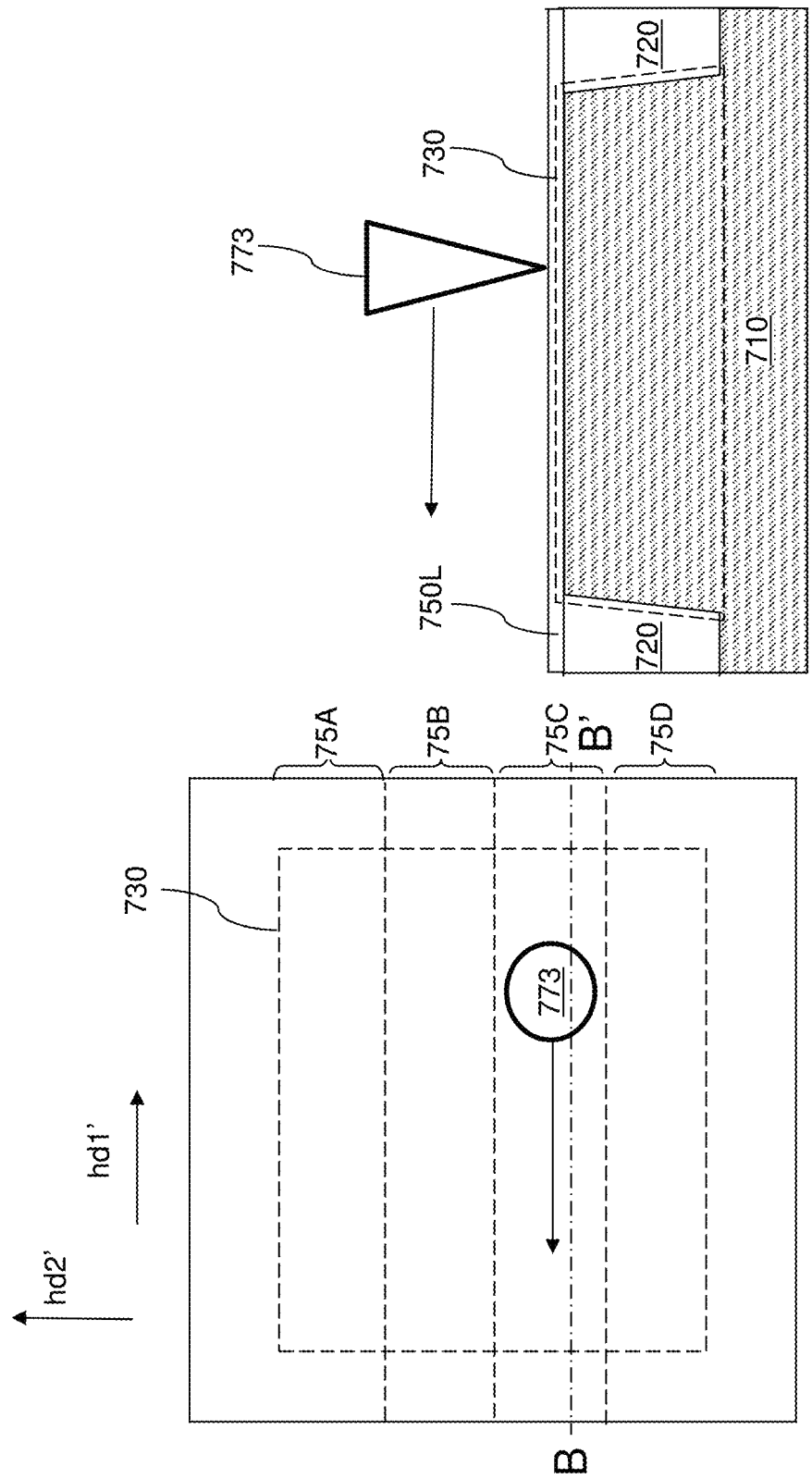

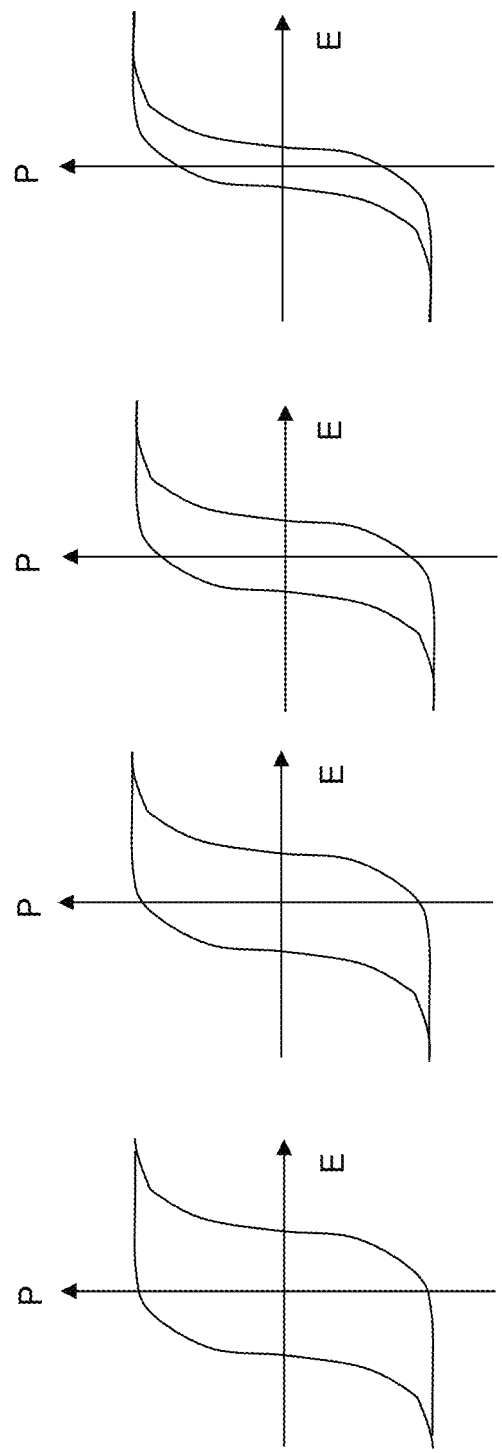

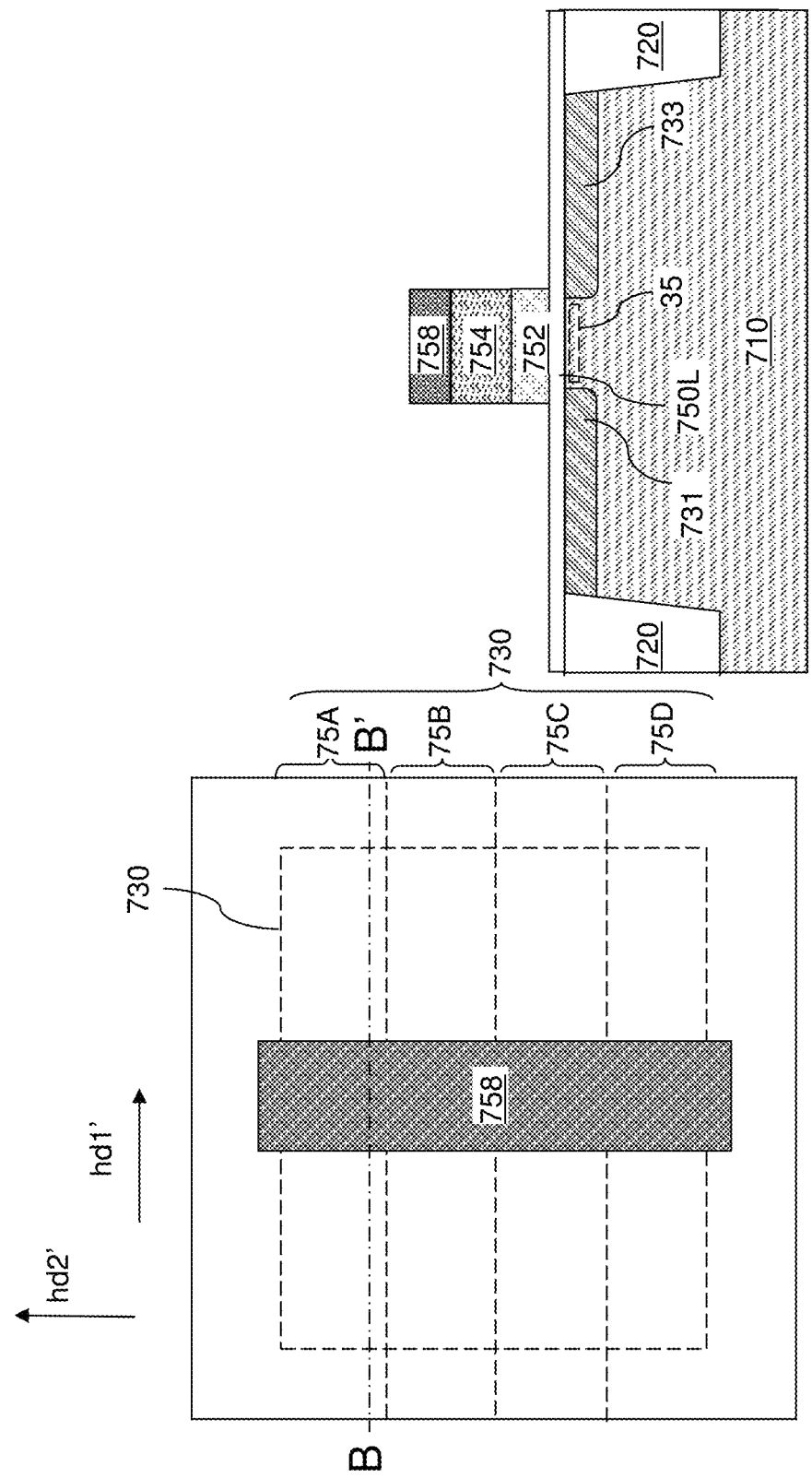

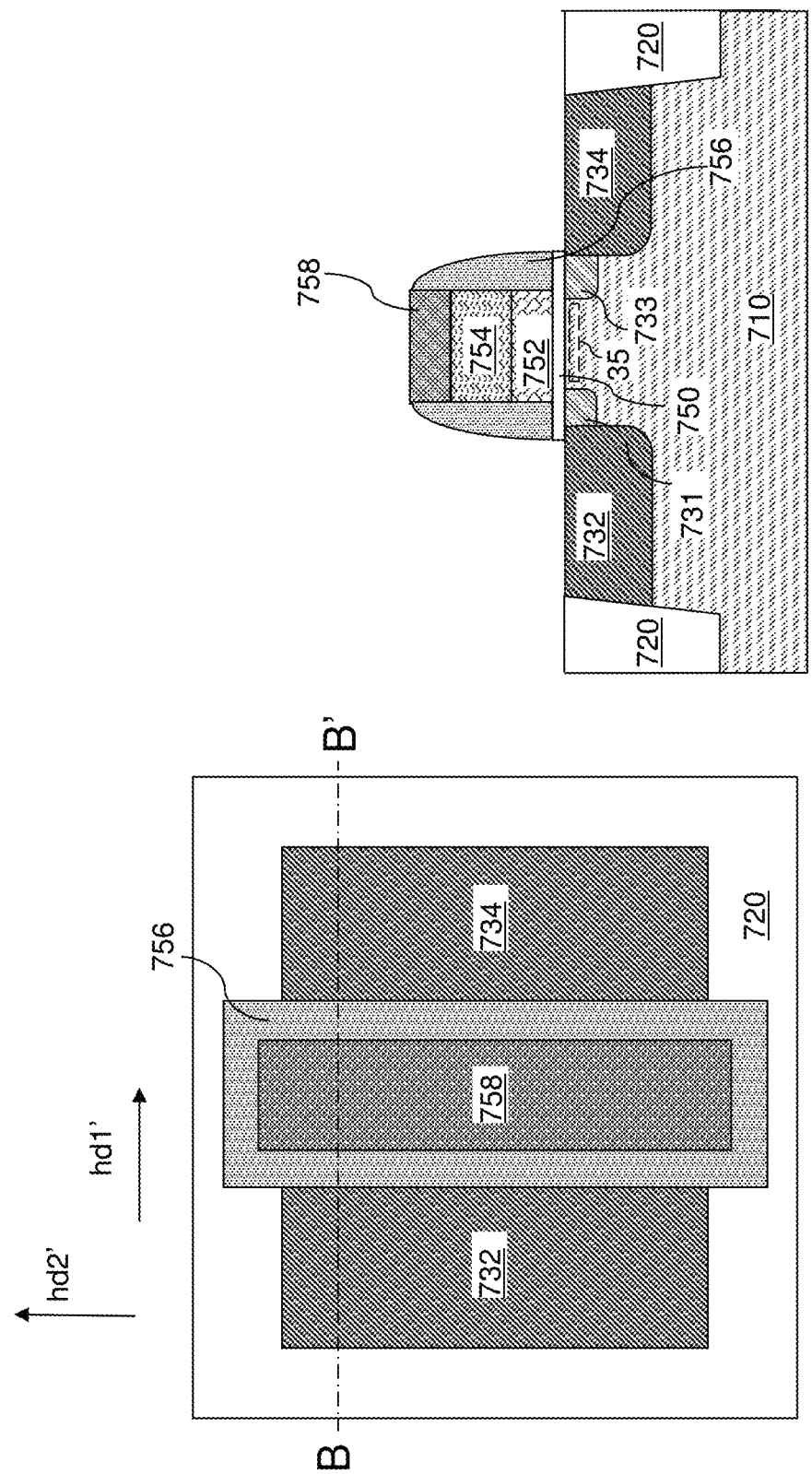

FERROELECTRIC DEVICE WITH MULTIPLE POLARIZATION STATES AND METHOD OF MAKING THE SAME

RELATED APPLICATIONS

This application is a continuation-in-part (CIP) application of U.S. application Ser. No. 16/227,889 filed on Dec. 20, 2018, the entirety of which is incorporated herein by reference.

FIELD

The present disclosure relates generally to the field of semiconductor devices and specifically to a ferroelectric device containing a ferroelectric layer with multiple polarization states and methods of making the same.

BACKGROUND

A ferroelectric memory device is a memory device containing a ferroelectric material to store information. The ferroelectric material acts as the memory material of the memory device. The dipole moment of the ferroelectric material is programmed in two different orientations (e.g., "up" or "down" polarization positions based on atom positions, such as oxygen and/or metal atom positions, in the crystal lattice) depending on the polarity of the applied electric field to the ferroelectric material to store information in the ferroelectric material. The different orientations of the dipole moment of the ferroelectric material can be detected by the electric field generated by the dipole moment of the ferroelectric material. For example, the orientation of the dipole moment can be detected by measuring electrical current passing through a semiconductor channel provided adjacent to the ferroelectric material in a field effect transistor ferroelectric memory device.

SUMMARY

According an aspect of the present disclosure, a ferroelectric device includes a semiconductor channel region, a gate electrode, and a ferroelectric gate dielectric located between the channel region and the gate electrode, and including a plurality of ferroelectric gate dielectric portions having different structural defect densities.

According another aspect of the present disclosure a ferroelectric device, comprises a two-dimensional metal dichalcogenide semiconductor channel region, a gate electrode, and a ferroelectric gate dielectric located adjacent to the channel region and including a plurality of different ferroelectric gate dielectric portions.

According another aspect of the present disclosure, a method of forming a ferroelectric device comprises forming a source region and a drain region that are laterally spaced apart from each other by a channel region, forming a ferroelectric gate dielectric over the channel region, forming different structural defects in the ferroelectric gate dielectric, wherein a plurality of ferroelectric gate dielectric portions have different structural defect densities, and forming a gate electrode over each of the plurality of ferroelectric gate dielectric portions.

BRIEF DESCRIPTION OF THE DRAWINGS

FIG. 17A is a top-down view of a fifth exemplary structure after a first masked ion implantation process according to the fifth embodiment of the present disclosure.

FIG. 17B is a vertical cross-sectional view along the vertical plane B-B' of FIG. 17A.

FIG. 19A is a top-down view of a fifth exemplary structure after a third masked ion implantation process according to the fifth embodiment of the present disclosure.

FIG. 19B is a vertical cross-sectional view along the vertical plane B-B' of FIG. 19A.

FIGS. 20A-20D are hysteresis curves of various ferroelectric gate dielectric portions of the ferroelectric gate dielectric of the fifth exemplary structure according to the fifth embodiment of the present disclosure.

FIG. 21A is a top-down view of a fifth exemplary structure after formation of a gate stack structure and extension active regions according to the fifth embodiment of the present disclosure.

FIG. 21B is a vertical cross-sectional view along the vertical plane B-B' of FIG. 21A.

FIG. 22A is a top-down view of a fifth exemplary structure after formation of a gate spacer and deep active regions according to the fifth embodiment of the present disclosure.

FIG. 22B is a vertical cross-sectional view along the vertical plane B-B' of FIG. 22A.

DETAILED DESCRIPTION

Figure 1:
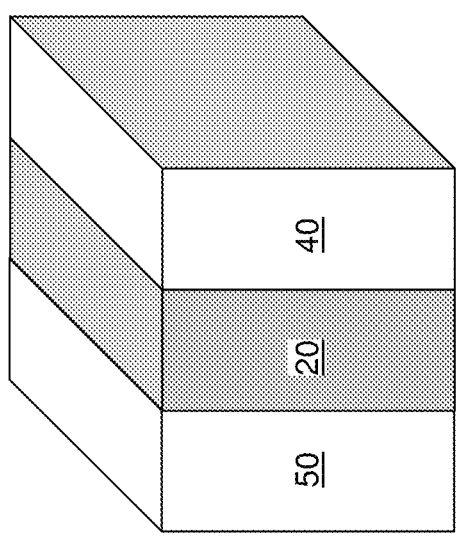
FIG. 1 is a perspective view of a metal-ferroelectric-semiconductor structure.

As discussed above, the embodiments of the present disclosure are directed to a ferroelectric device that contains a ferroelectric gate dielectric with multiple regions having different polarization states due to a different density of structural defects in each region. The multiple regions of the ferroelectric gate dielectric are located between the same gate and the same channel, such that the multiple different polarization states provide multiple non-volatile conductance states for the channel. If the device is a memory device, then the ferroelectric gate dielectric is a memory layer having multiple polarization states which provide a memory cell having more than one bit per cell (i.e., multi-level data storage). The multiple non-volatile conductance states may be deterministically controlled by varying the magnitude of the applied gate voltage (e.g., the magnitude of the voltage pulse applied to the gate). If the device is a logic or a sensor device, then ferroelectric gate dielectric functions as a gate insulating layer of a transistor with multiple conductance states in adjacent regions of the same channel.

The drawings are not drawn to scale. Multiple instances of an element may be duplicated where a single instance of the element is illustrated, unless absence of duplication of elements is expressly described or clearly indicated otherwise. Same reference numerals refer to the same element or to a similar element. Elements having the same reference numerals are presumed to have the same material composition unless expressly stated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the first continuous structure. For example, a layer may be located between any pair of horizontal planes between, or at, a top surface and a bottom surface of the first continuous structure. A layer may extend horizontally, vertically, and/or along a tapered surface. A substrate may be a layer, may include one or more layers therein, or may have one or more layer thereupon, thereabove, and/or therebelow. As used herein, a "layer stack" refers to a stack of layers. As used herein, a "line" or a "line structure" refers to a layer that has a predominant direction of extension, i.e., having a direction along which the layer extends the most.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor.

As used herein, a "semiconducting material" refers to a material having electrical conductivity in the range from $1.0 \times 10^{-6}$ S/m to $1.0 \times 10^5$ S/m. As used herein, a "semiconductor material" refers to a material having electrical conductivity in the range from $1.0 \times 10^{-6}$ S/m to 1.0 S/m in the absence of electrical dopants therein, and is capable of producing a doped material having electrical conductivity in a range from 1.0 S/m to $1.0 \times 10^5$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-6}$ S/m. As used herein, a "heavily doped semiconductor material" refers to a semiconductor material that is doped with electrical dopant at a sufficiently high atomic concentration to become a conductive material, i.e., to have electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/m to $1.0 \times 10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition. As used herein, a "ferroelectric material" refers to any material that exhibits spontaneous electric polarization that can be reversed by the application of an external electric field.

Referring to FIG. 1, a metal-ferroelectric-semiconductor structure according to an embodiment of the present disclosure is illustrated. The metal-ferroelectric-semiconductor structure includes metal portion that comprises as a gate electrode 50, a ferroelectric material portion that comprises a gate dielectric/ferroelectric memory element 20, and a semiconductor portion that comprises a semiconductor channel 40 in a ferroelectric memory device to be described below.

Figure 2:
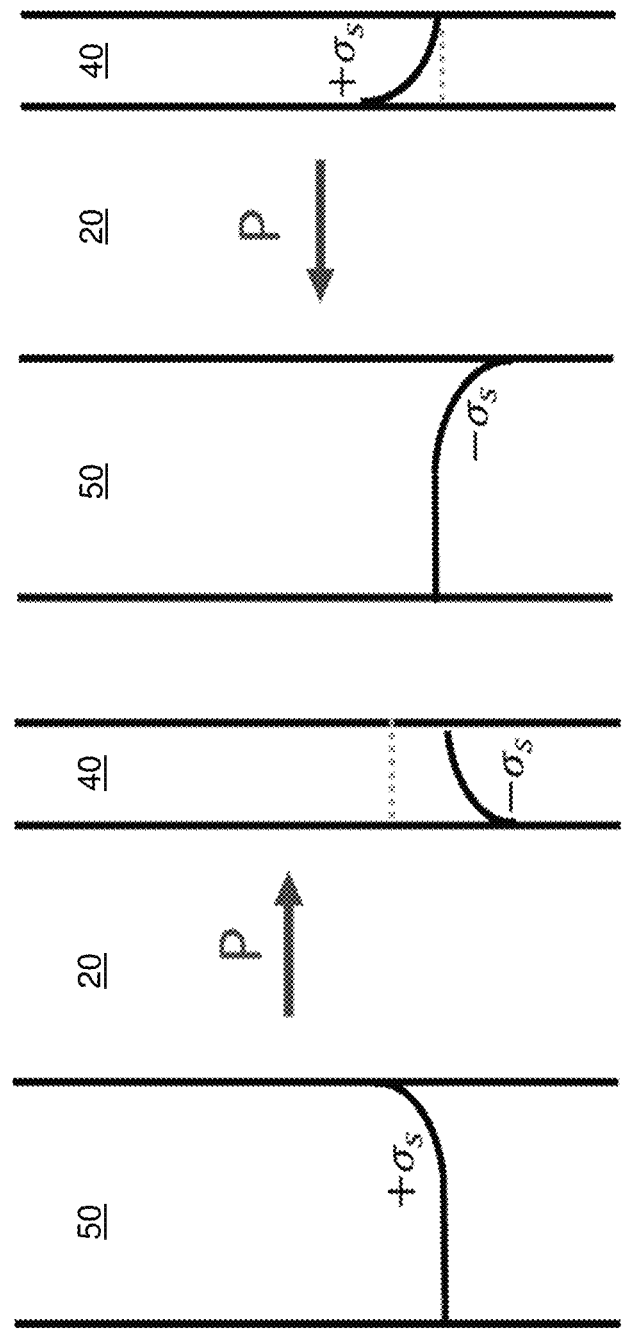
FIG. 2A is a potential diagram for a first polarization state of the metal-ferroelectric-semiconductor structure of FIG. 1.
FIG. 2B is a potential diagram for a second polarization state of the metal-ferroelectric-semiconductor structure of FIG. 1.

Referring to FIGS. 2A and 2B, potential diagrams are illustrated for polarization states of the metal-ferroelectric-semiconductor structure of FIG. 1. FIG. 2A illustrates a first polarization state of the metal-ferroelectric-semiconductor structure of FIG. 1 in which the ferroelectric polarization vector P points in the positive polarization direction from the metal portion (such as a gate electrode 50) to the semiconductor portion (such as a semiconductor channel 40). In this case, positive ferroelectric charges are present on the side of the ferroelectric material portion (such as the gate dielectric 20) at the interface with the semiconductor portion (such as the semiconductor channel 40), and negative ferroelectric charges are present on the side of the ferroelectric material portion (such as the gate dielectric 20) at the interface with the metal portion (such as the gate electrode 50). The ferroelectric charges induce screening charges within the metal portion and within the semiconductor portion. The screening charges are mobile electrical charges (such electrons or holes) that reduce the electric fields caused by the ferroelectric charges within the ferroelectric material portion. Positive screening charges accumulate within the metal portion (such as a gate electrode 50), and negative screening charges accumulate within the semiconductor portion (such as a semiconductor channel 40).

FIG. 2B illustrates a second polarization state of the metal-ferroelectric-semiconductor structure of FIG. 1 in which the ferroelectric polarization vector P points in the negative polarization direction from the semiconductor portion (such as a semiconductor channel 40) to the metal portion (such as a gate electrode 50). In this case, negative ferroelectric charges are present on the side of the ferroelectric material portion (such as the gate dielectric 20) at the interface with the semiconductor portion (such as the semiconductor channel 40), and positive ferroelectric charges are present on the side of the ferroelectric material portion (such as the gate dielectric 20) at the interface with the metal portion (such as the gate electrode 50). The ferroelectric charges induce screening charges within the metal portion and within the semiconductor portion. Negative screening charges accumulate within the metal portion (such as a gate electrode 50), and positive screening charges accumulate within the semiconductor portion (such as a semiconductor channel 40).

The screening potential at the interface between the ferroelectric material portion and the metal portion can be controlled by switching the polarization direction of the ferroelectric material portion. The electrostatic potential $V_c(x)$ as a function of a distance x from the interface between the metal portion and the ferroelectric material portion decays with a characteristic decay distance, which is referred to as the Thomas-Fermi screening length. If the x-axis is selected such that the x-coordinate is positive within the ferroelectric material portion having a thickness of d and with the semiconductor material portion, the electrostatic potential $V_c(x)$ within the metal portion and the semiconductor material portion is governed by the equation, $$\frac{d^2 V_c(x)}{dx^2} = \frac{V_c(x)}{\lambda^2},$$

in which λ is the Thomas-Fermi screening length within the respective material portion.

In case the metal portion (such as the gate electrode 50) is much thicker than the screening length $\lambda_l$ for the metal portion, and if the semiconductor material portion (such as the semiconductor channel 40) is thinner, the solution to the electrostatic potential $V_c(x)$ for the semiconductor material portion (i.e., x>d) is given by:

$$V_c(x) = -\frac{dP\lambda'_l}{\varepsilon_0(\varepsilon(\lambda_r + \lambda'_l) + d)} e^{-|x-d|/\lambda'_l},$$

in which d is the thickness of the ferroelectric material portion, P is the ferroelectric polarization of the ferroelectric material portion, $\varepsilon_0$ is the permittivity of vacuum, ε is the relative permittivity of the ferroelectric material portion (i.e., the ratio of the permittivity of the ferroelectric material portion to the permittivity of vacuum), $\lambda_l$ is the Thomas-Fermi screening length for the metal portion, $\lambda_r$ is the Thomas-Fermi screening length for the semiconductor material portion, l is the thickness of the semiconductor material portion, and $\lambda'_l$ is given by:

$$\lambda'_l = \frac{\lambda_l}{1 - e^{-l/\lambda_l}}.$$

According to an aspect of the present disclosure, the electrostatic potential in the interfacial region of the semiconductor material portion in proximity to the ferroelectric material portion can be controlled by reversing the ferroelectric polarization within the ferroelectric material portion. For the positive polarization direction illustrated in FIG. 2A, the screening charges bring the Fermi level into the conduction band of the semiconductor material of the semiconductor material portion. For the negative polarization direction illustrated in FIG. 2B, the screening charges move the Fermi level towards the band gap. Thus, the Fermi level moves between a position in the semiconductor band gap and a position in one of the bands (e.g., conduction or valence band) by reversing the ferroelectric polarization direction, which leads to a large difference between the resistive (e.g., resistivity or resistance) states of the device.

According to an aspect of the present disclosure, the semiconductor material portion includes a two-dimensional semiconductor material providing high conductivity within a two-dimensional plane that is parallel to the interface between the semiconductor material portion and the ferroelectric material portion. As used herein, a two-dimensional semiconductor material refers to a semiconductor material having a thickness of 1 to 5 monolayers, such as 2 to 3 monolayers of the atoms of the semiconductor material and/or which contains a two-dimensional charge carrier gas, such as a two-dimensional electron gas. In one embodiment, the two-dimensional semiconductor material has a lateral extent along one direction that induces quantum mechanical modification of the band structure. In one embodiment, a two-dimensional semiconductor material can have a lateral direction less than 10 nm along one direction, which is herein referred to as the thickness direction of the two-dimensional semiconductor material.

According to an aspect of the present disclosure, the semiconductor material portion includes a two-dimensional semiconductor material layer having a thickness of 1 to 5 monolayer and having a band gap of at least 1 eV, such as at least 1.15 eV, for example 1.15 eV to 5.65 eV. Alternatively, it may include a layer of a two-dimensional charge carrier gas (such as a two-dimensional electron gas) and a band gap of at least 1 eV, such as at least 1.15 eV, for example 1.15 eV to 5.65 eV. As used herein, a two-dimensional charge carrier gas refers to a collection of charge carriers in quantum confinement that provides enhanced conductivity along directions that are perpendicular to the direction of the quantum confinement. For example, a two-dimensional electron gas is a two-dimensional charge carrier gas. In one embodiment, the semiconductor material portion includes a two-dimensional semiconductor material selected from hexagonal boron nitride having a band gap of 5.62 eV, fluorinated graphene having a band gap of 2.93 eV, molybdenum disulfide having a band gap of 2.24 eV, and germanane having a band gap of 1.16 eV. The list of possible candidates of two-dimensional semiconductor materials is not limited with aforementioned materials.

Figure 3:
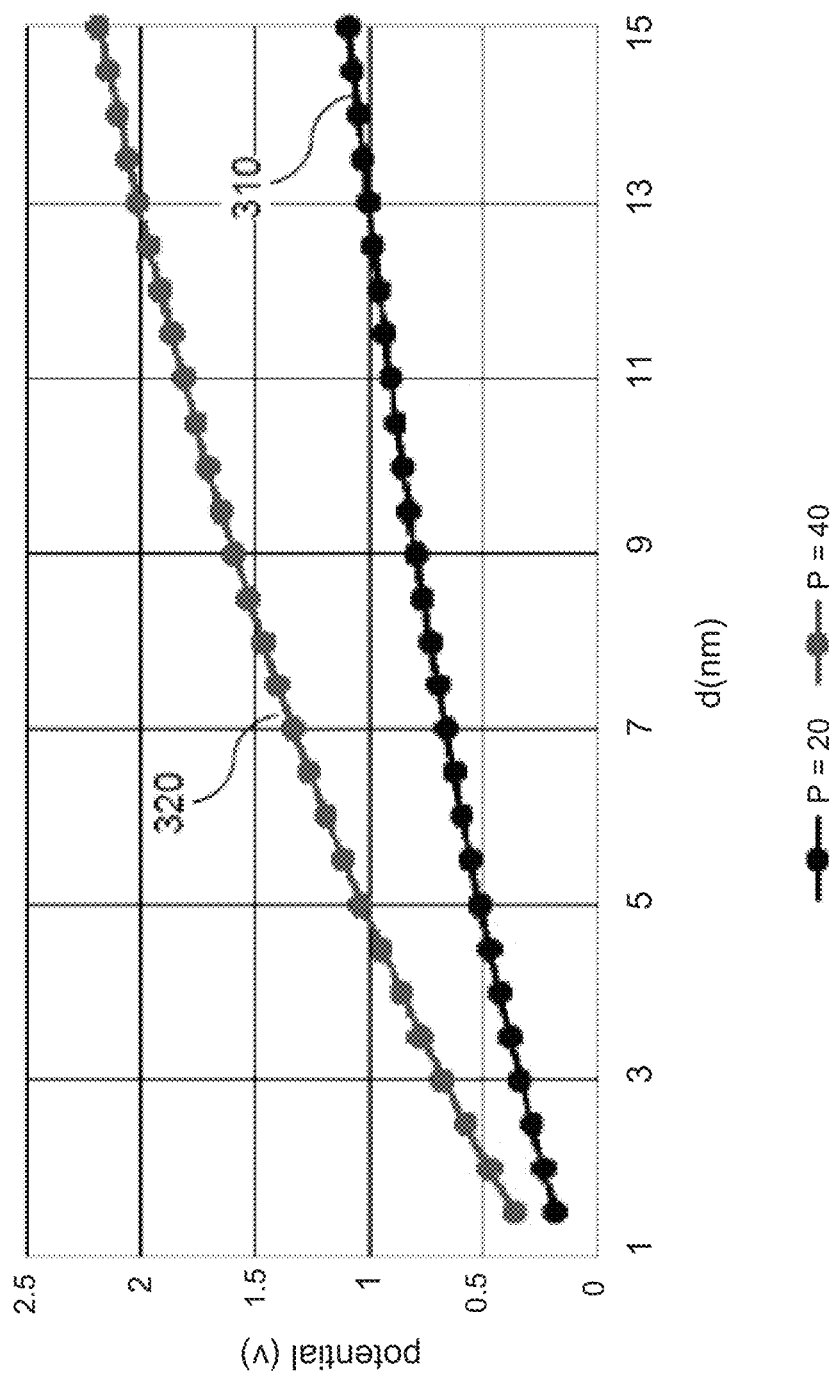
FIG. 3 is a plot of the electrostatic potential at the interface between the ferroelectric material portion and the metal portion as a function of the ferroelectric thickness for the metal-ferroelectric-semiconductor structure for two selected ferroelectric polarization densities.

FIG. 3 is a plot of the electrostatic potential $V_c(0)$ at the interface between the ferroelectric material portion and the metal portion as a function of the ferroelectric thickness d for the metal-ferroelectric-semiconductor structure of FIG. 1 calculated within the Thomas-Fermi model. According to this model the electrostatic potential $V_c(0)$ at the interface between the ferroelectric material portion and the semiconductor portion is given by:

$$V_c(0) = -\frac{dP\lambda_l'}{\varepsilon_0(\varepsilon(\lambda_r + \lambda_l') + d)}.$$

A first curve 310 corresponds to the case in which the ferroelectric polarization is 20 μC/cm², the relative permittivity of the ferroelectric material portion is 90, the Thomas-Fermi screening length for the metal portion is 0.2 nm, and the Thomas-Fermi screening length for the semiconductor material portion is 0.2 nm. A second curve 320 corresponds to the case in which the ferroelectric polarization is 40 μC/cm², the relative permittivity of the ferroelectric material portion is 90, the Thomas-Fermi screening length for the metal portion is 0.2 nm, and the Thomas-Fermi screening length for the semiconductor material portion is 0.2 nm. Electrostatic potential greater than 1.0 V, and/or greater than 1.5 V, and/or greater than 2.0 V can be generated at the interface between the ferroelectric material portion and the metal portion through ferroelectric polarization effect.

Figure 4:
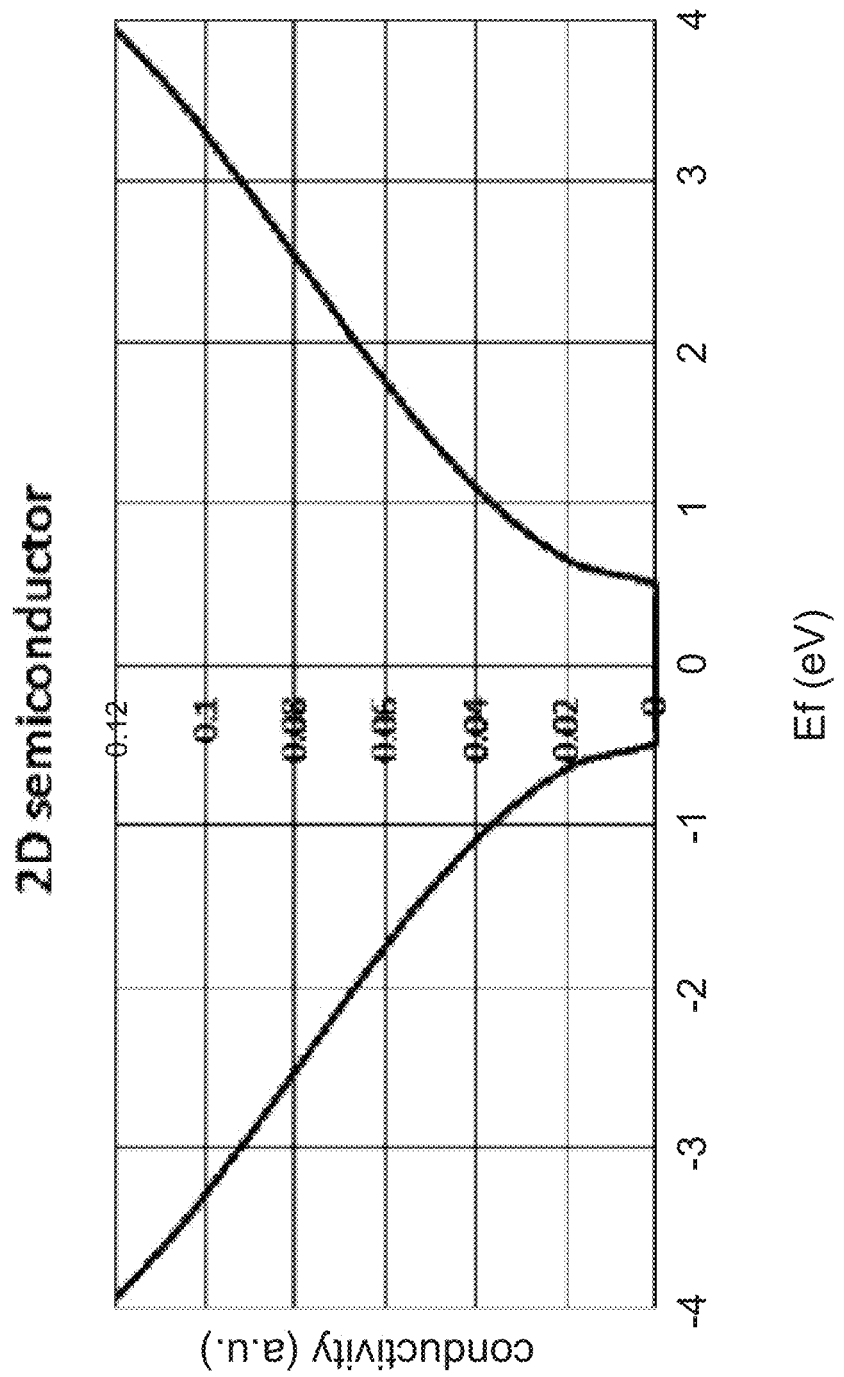
FIG. 4 is a graph of conductivity as a function of the Fermi level for a two-dimensional generic semiconductor material.

FIG. 4 a graph of electrical conductivity as a function of the Fermi level for a hypothetical two-dimensional semiconductor material (e.g., for a monolayer of the semiconductor material). For the purpose of the calculation in FIG. 4, a simple model of a two-dimensional semiconductor material based on the two-band tight binding Hamiltonian was employed. When such a two-dimensional semiconductor material is employed for the semiconductor material portion of the device of FIG. 1, it is possible to switch the state of the two-dimensional semiconductor material between a conducting state and an insulating state by reversing the direction of the ferroelectric polarization as illustrated in FIGS. 2A and 2B. In other words, the shift in the Fermi level in the device of FIG. 1 can be sufficient to provide two distinct resistive states, such as a higher resistive state and a lower resistive state, which may be, for example, a conducting state and an insulating state.

According to an embodiment of the present disclosure, the functional dependence of the electrical conductivity on the Fermi level illustrated in FIG. 4 can be physically manifested in any suitable two-dimensional semiconductor material, such as hexagonal boron nitride, fluorinated graphene, molybdenum disulfide, germanane, etc.

Table 1 below shows calculated values for the band gap and for conduction band onsite energy for the various materials that can be employed in the ferroelectric memory device of the present disclosure. The band gap values were obtained from first principles electronic structure calculations based on the hybrid functional and the tight binding onsite energies were fitted to reproduce calculated band structures.

TABLE 1

Band gap and the conduction band onsite energy for two-dimensional semiconductor materials

| Two-dimensional semiconductor material | Band gap (eV) | Conduction band onsite energy (eV) |
| --- | --- | --- |
| Hexagonal BN | 5.62 | 6.81 |
| MoS₂ | 2.24 | 5.12 |
| Fluorinated graphene | 2.93 | 5.465 |
| Germanane | 1.16 | 4.58 |

A list of other suitable highly stable two-dimensional semiconductor materials and their band gaps calculated within DFT taken from the following database (https://cmrdb.fysik.dtu.dk/c2db/?x=29127&limit=200) is shown in Table 2. DFT is known to underestimates the band gap values, therefore the real band gaps are expected to be larger.

TABLE 2

Band gap for additional two-dimensional semiconductor materials

| Two-dimensional semiconductor material | Band gap (eV) |
| --- | --- |
| Au₂S₂ | 1.218 |
| GeS | 2.447 |

TABLE 2-continued

Band gap for additional two-dimensional semiconductor materials

| Two-dimensional semiconductor material | Band gap (eV) |
|---|---|
| GeSe | 2.219 |
| GeTe | 1.468 |
| SnS | 2.288 |
| SnSe | 2.152 |
| AsBrS | 1.387 |
| AsBrSe | 1.228 |
| AsClSe | 1.374 |
| AsISe | 1.152 |
| AsIS | 1.338 |
| AsBrTe | 1.238 |
| BrSSb | 1.220 |
| ISSb | 1.223 |
| ClSbTe | 1.258 |
| VBrCl | 1.290 |
| VBrI | 1.189 |
| $Cu_2Br_2$ | 1.496 |
| $Rb_2F_2$ | 4.557 |
| $Cs_2F_2$ | 4.151 |
| $Al_2S_2$ | 2.142 |
| $Al_2Se_2$ | 2.138 |
| $Ga_2S_2$ | 2.180 |
| $In_2S_2$ | 1.604 |
| $MnCl_2$ | 2.025 |
| $MnBr_2$ | 1.775 |
| $ZnF_2$ | 4.425 |
| $ZnCl_2$ | 4.213 |
| $ZnI_2$ | 2.432 |
| $GeS_2$ | 1.344 |
| $GeO_2$ | 3.006 |
| $MnI_2$ | 1.223 |
| $ZnBr_2$ | 3.272 |
| $SnS_2$ | 1.438 |
| $BaBr_2$ | 4.902 |
| $BaCl_2$ | 5.618 |
| $CaBr_2$ | 4.863 |
| $CaI_2$ | 3.537 |
| $CdI_2$ | 2.136 |
| $GeI_2$ | 1.954 |
| $HgBr_2$ | 1.982 |
| $MgBrI_2$ | 4.588 |
| $MgI_2$ | 3.273 |
| $MnBr_2$ | 1.477 |
| $MnCl_2$ | 1.797 |
| $NiCl_2$ | 1.217 |
| $PbBr_2$ | 2.004 |
| $SrBr_2$ | 4.929 |
| $SrI_2$ | 3.984 |
| $VBr_2$ | 1.252 |
| $VCl_2$ | 1.354 |
| $VI_2$ | 1.206 |
| $ZnBr_2$ | 3.353 |
| $ZnCl_2$ | 4.453 |
| $ZnI_2$ | 1.749 |
| $CaBr_2$ | 4.128 |
| $CaCl_2$ | 4.771 |
| $CaI_2$ | 2.946 |
| $MgCl_2$ | 4.762 |
| $SrCl_2$ | 4.944 |
| $Co_2Cl_6$ | 1.130 |
| $Cr_2Br_6$ | 1.644 |
| $Cr_2Cl_6$ | 1.735 |
| $Mo_2Br_6$ | 1.561 |
| $Rh_2Br_6$ | 1.344 |
| $Rh_2Cl_6$ | 1.590 |
| $Cr_2CF_2$ | 1.166 |
| $Y_2CF_2$ | 1.117 |
| MoSeTe | 1.136 |
| MoSSe | 1.453 |
| WSSe | 1.401 |
| WSTe | 1.142 |
| BiBrS | 1.250 |
| BiClS | 1.497 |
| BiClSe | 1.290 |
| BrSSb | 1.427 |
| BrSbTe | 1.318 |
| BrSbSe | 1.462 |
| AsBrS | 1.417 |
| $Pd_2S_4$ | 1.120 |
| $Pd_2Se_4$ | 1.313 |
| $Pd_2Te_4$ | 1.212 |
| $Pt_2S_4$ | 1.802 |
| $Pt_2Se_4$ | 1.441 |
| $Pt_2Te_4$ | 1.309 |
| $Re_4S_8$ | 1.276 |
| $Re_4Se_8$ | 1.110 |
| $GeO_2$ | 3.641 |
| $HfS_2$ | 1.221 |
| $MoSe_2$ | 1.321 |
| $NiO_2$ | 1.281 |
| $PbO_2$ | 1.346 |
| $PbS_2$ | 1.390 |
| $PdO_2$ | 1.379 |
| $PdS_2$ | 1.171 |
| $PtO_2$ | 1.674 |
| $PtS_2$ | 1.688 |
| $PtSe_2$ | 1.167 |
| $SnO_2$ | 2.683 |
| $SnS_2$ | 1.587 |
| $WO_2$ | 1.340 |
| $WS_2$ | 1.534 |
| $WSe_2$ | 1.238 |
| $ZrS_2$ | 1.159 |
| $CrW_3S_8$ | 1.126 |
| $Mo_2W_2S_8$ | 1.532 |
| $Mo_3WS_8$ | 1.559 |
| $MoW_3S_8$ | 1.258 |
| $Al_2Br_2O_2$ | 4.142 |
| $Al_2Br_2S_2$ | 2.263 |
| $Al_2Br_2Se_2$ | 1.535 |
| $Al_2Cl_2S_2$ | 2.334 |
| $Al_2I_2S_2$ | 1.615 |
| $Al_2I_2Se_2$ | 1.493 |
| $Cr_2Cl_2O_2$ | 1.190 |
| $Ga_2Br_2O_2$ | 2.515 |
| $Hf_2Br_2N_2$ | 2.064 |
| $Hf_2Cl_2N_2$ | 2.101 |
| $Sc_2Br_2S_2$ | 2.130 |
| $Sc_2Br_2Se_2$ | 1.510 |
| $Sc_2Cl_2Se_2$ | 1.409 |
| $Sc_2I_2S_2$ | 1.662 |
| $Sc_2I_2Se_2$ | 1.393 |
| $Al_2S_2$ | 2.085 |
| $Al_2Se_2$ | 1.997 |
| $Al_2Te_2$ | 1.748 |
| $Ga_2O_2$ | 1.556 |
| $Ga_2S_2$ | 2.321 |
| $Ga_2Se_2$ | 1.765 |
| $In_2S_2$ | 1.675 |
| $Hf_2O_6$ | 3.470 |
| $Ti_2O_6$ | 2.461 |
| $Zr_2O_6$ | 3.586 |
| $Mn_2Br_4$ | 1.818 |
| $Mn_2Cl_4$ | 2.033 |
| $Mn_2I_4$ | 1.349 |
| $Mn_2O_4$ | 1.287 |
| $Ti_2O_4$ | 2.855 |
| $V_2Br_4$ | 1.294 |
| $V_2Cl_4$ | 1.426 |
| $V_2I_4$ | 1.157 |
| $C_2H_2$ | 3.460 |
| $CH_2Si$ | 4.000 |

Figure 5:
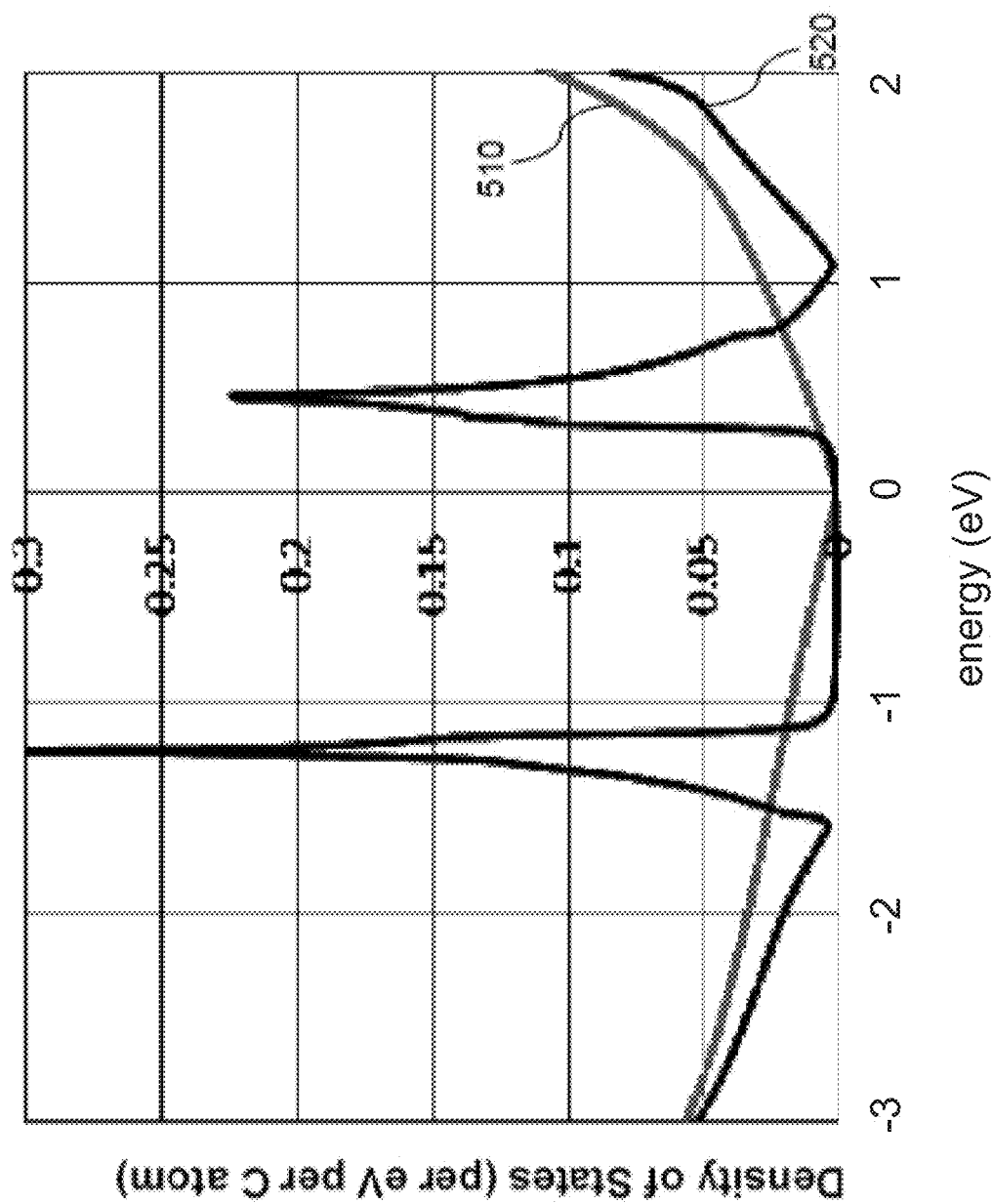
FIG. 5 is a graph of the density of states per eV per atom for pristine graphene and for fluorinated graphene calculated within the tight binding model.

Pristine graphene (i.e., graphene without defects or dopants) is an electrical conductor which lacks a band gap, while a fluorinated graphene is a semiconductor having a band gap. FIG. 5 is a graph of the density of states per eV per carbon atom for pristine graphene and for fluorinated graphene. The tight binding model was employed for the purpose of the calculation for the density of states per energy. Curve 510 represents the density of states per eV per carbon atom for pristine graphene. Curve 520 represents the density of states per eV per carbon atom for fluorinated graphene. Pristine graphene provides non-zero density of states at all energies other than zero, and thus, does not provide a voltage at which pristine graphene becomes insulating. Fluorinated graphene provides an energy band at which the density of states is zero, and thus, provides a voltage range at which fluorinated graphene functions as an insulating material.

Figure 6:
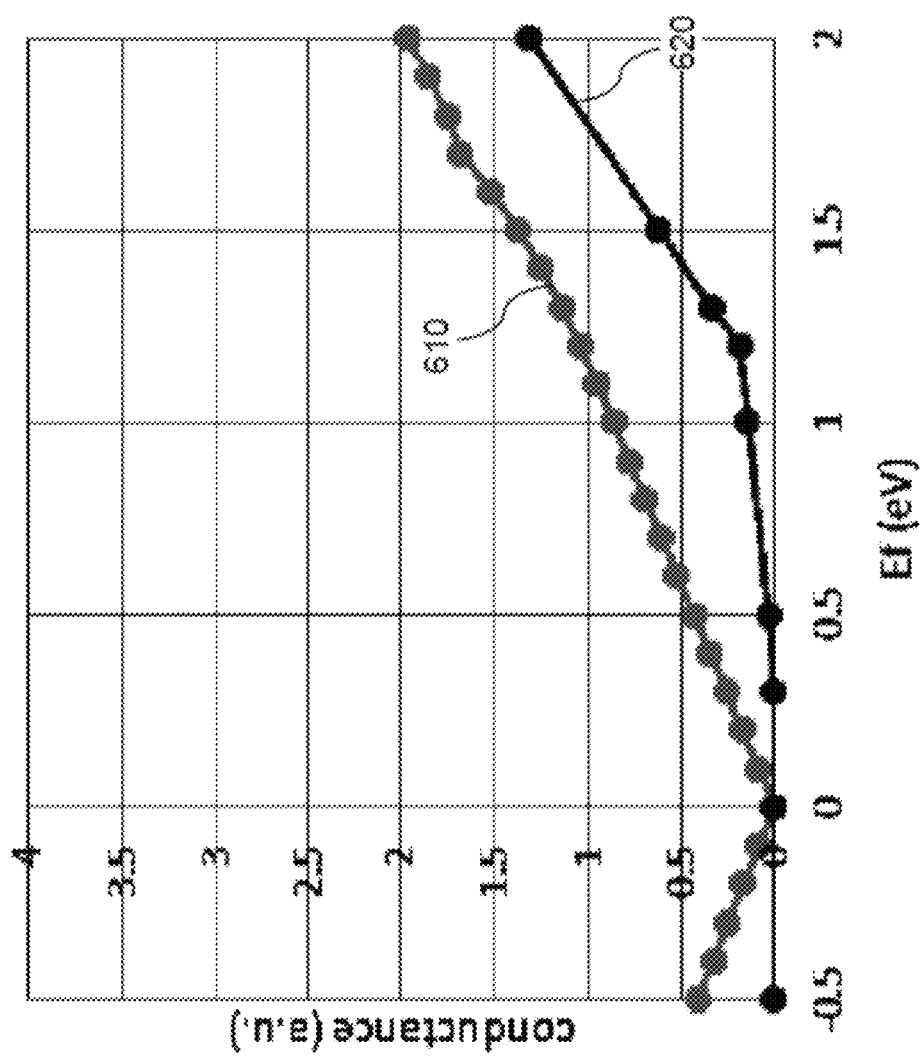
FIG. 6 is a graph of the conductance as a function of Fermi level for pristine graphene and for fluorinated graphene calculated within the tight binding model.

Referring to FIG. 6, the calculated conductance of pristine graphene and fluorinated graphene is plotted as a function of the Fermi energy. Curve 610 represents the conductance of pristine graphene, and curve 620 represents the conductance of fluorinated graphene. Fluorinated graphene provides an energy range in which conductance is negligible and the fluorinated graphene functions as an insulating material for Fermi level of 0.5 eV or less. In contrast, pristine graphene does not provide an energy range in which pristine graphene can function as an insulating material.

The atomic percentage of fluorine in the fluorinated graphene can be in a range from 0.1% to 60%, such as from 0.5% to 50%, including from 0.1% to 0%. Thus, fluorinated graphene can include but is not limited to graphene fluoride having a roughly 1:1 ratio of carbon to fluorine atoms. The location and the width of the energy band at which the density of states is zero in fluorinated graphene changes with the atomic concentration of the fluorine atoms within fluorinated graphene. Thus, switching between an insulating state and a conducting state within the device of FIG. 1 is possible for fluorinated graphene semiconductor material which functions as the semiconductor material portion. Other semiconductor materials which have a sufficient band gap, such as molybdenum disulfide, hexagonal boron nitride, or germanane may be employed in lieu of fluorinated graphene in the device of FIG. 1.

Figure 7:
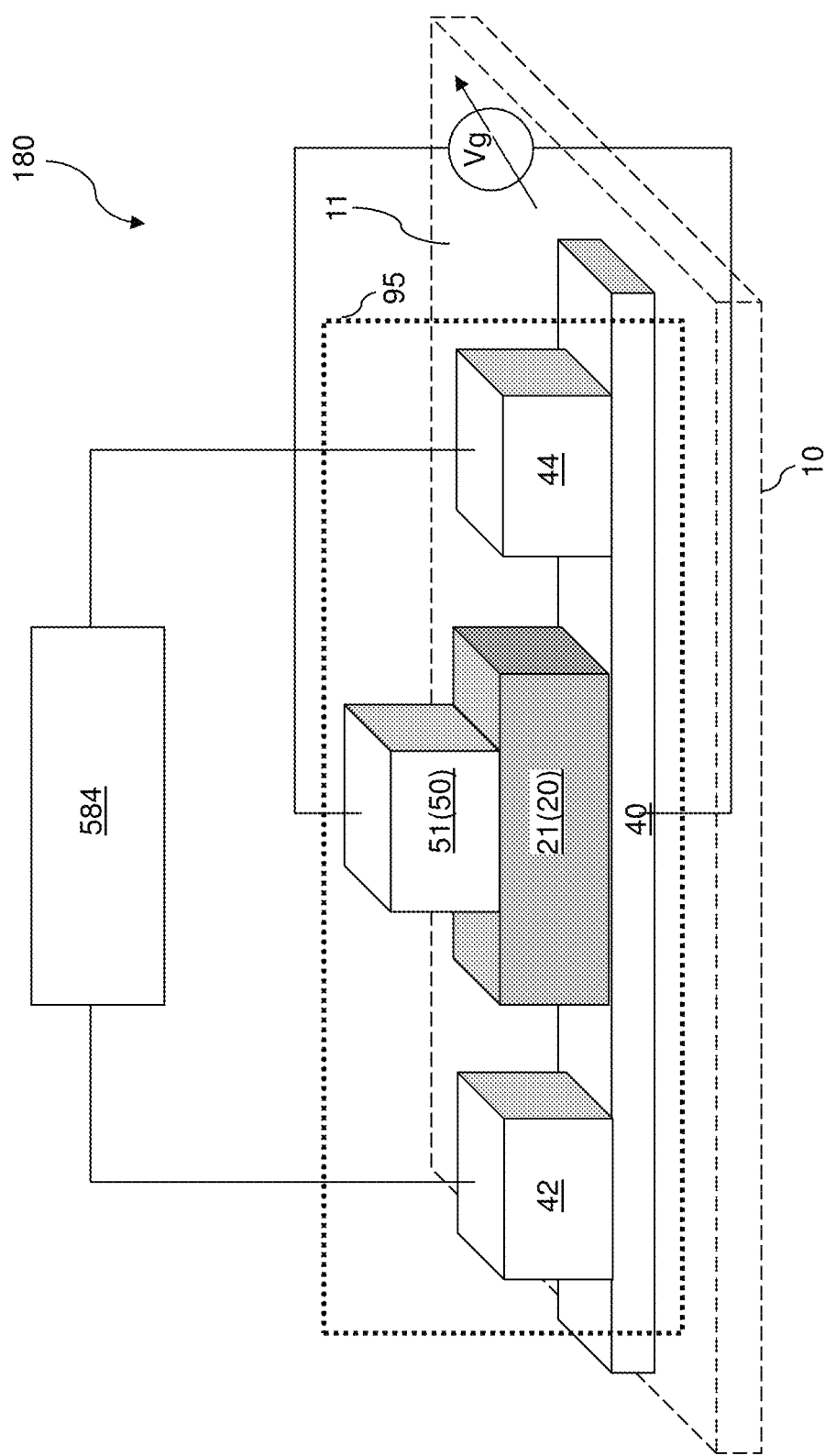
FIG. 7 is a first exemplary structure according to a first embodiment of the present disclosure.

FIG. 7 illustrates a first exemplary structure 180 according to a first embodiment of the present disclosure. The first ferroelectric memory device 180 includes a transistor 95 containing semiconductor channel 40. The semiconductor channel 40 can be configured to provide a two-dimensional charge carrier gas layer, such as a 2DEG layer or a semiconductor material selected from fluorinated graphene, hexagonal boron nitride, molybdenum disulfide, germanane, or a similar two-dimensional material with a sufficient band gap. The semiconductor channel 40 may consist of only the two-dimensional charge carrier gas layer or it may include additional semiconductor material in addition to the two-dimensional charge carrier gas layer. The two-dimensional charge carrier gas layer can be located within a two-dimensional Euclidean plane. In one embodiment, the semiconductor channel 40 can have a thickness in a range from 0.3 nm to 10 nm, such as from 0.6 nm to 5 nm. The two-dimensional charge carrier gas layer functions as a channel within a transistor 95 (e.g., a ferroelectric memory cell) of the first ferroelectric memory device 180.

A ferroelectric memory element 21 is located adjacent to, such as on a surface of, the semiconductor channel 40, i.e., on a surface of the two-dimensional charge carrier gas layer. The ferroelectric memory element 21 functions as a gate dielectric 20 within the transistor 95 of the first ferroelectric memory device 180. The ferroelectric memory element 21 is in contact with a first surface of the semiconductor channel 40. The ferroelectric memory element 21 includes, and/or consists essentially of, at least one ferroelectric material such as barium titanate (such as $BaTiO_3$; BT), colernanite (such as $Ca_2B_6O_{11}.5H_2O$), bismuth titanate (such as $Bi_{12}TiO_{20}$, $Bi_4Ti_3O_{12}$ or $Bi_2Ti_2O_7$), europium barium titanate, ferroelectric polymer, germanium telluride, langbeinite (such as $M_2M'_2(SO_4)_3$ in which M is a monovalent metal and M' is a divalent metal), lead scandium tantalate (such as $Pb(Sc_xTa_{1-x})O_3$), lead titanate (such as $PbTiO_3$; PT), lead zirconate titanate (such as $Pb(Zr,Ti)O_3$; PZT), lithium niobate (such as $LiNbO_3$; LN), ($LaAlO_3$)), polyvinylidene fluoride $(CH_2CF_2)_n$, potassium niobate (such as $KNbO_3$), potassium sodium tartrate (such as $KNaC_4H_4O_6.4H_2O$), potassium titanyl phosphate (such as $KO_5PTi$), sodium bismuth titanate (such as $Na_{0.5}Bi_{0.5}TiO_3$ or $Bi_{0.5}Na_{0.5}TiO_3$) lithium tantalate (such as $LiTaO_3$ (LT)), lead lanthanum titanate (such as $(Pb,La)TiO_3$ (PLT)), lead lanthanum zirconate titanate (such as $(Pb,La)(Zr,Ti)O_3$ (PLZT)), ammonium dihydrogen phosphate (such as $NH_4H_2PO_4$ (ADP)), or potassium dihydrogen phosphate (such as $KH_2PO_4$ (KDP)). In one embodiment, the ferroelectric memory element 21 comprises, and/or consists essentially of, a ferroelectric dielectric material.

A front side conductive gate electrode 51 is located directly on the ferroelectric memory element 21 on the opposite side of the semiconductor channel 40. The front side conductive gate electrode 51 functions as the gate electrode 50 of the transistor 95 of the first ferroelectric memory device 180. The conductive gate electrode 51 is in contact with the ferroelectric memory element 21. The conductive gate electrode 51 can include, and/or consist essentially of, a metallic material such as an elemental metal (Ti, Ta, or W), an intermetallic alloy of at least two elemental metals, a metal-semiconductor compound (such as a metal silicide), or a conductive metallic alloy of at least one elemental metal (such as Ti, Ta, W) and a nonmetallic element (such as nitrogen and/or oxygen, such as TiN or WN).

A source contact 42 contacts a first portion of the semiconductor channel 40 and a drain contact 44 contacts a second portion of the semiconductor channel. The ferroelectric memory element 21 is located between the source contact 42 and the drain contact 44. The source contact 42 and the drain contact 44 can comprise, and/or consist essentially of, a respective metallic contact material. The metallic contact material may be a metal-semiconductor compound, a conductive metallic nitride, an elemental metal, or an intermetallic alloy material. In one embodiment, a metallic material that can be used for the conductive gate electrode 51 can also be used for the source contact 42 and the drain contact 44.

In one embodiment, the two-dimensional charge carrier gas layer is located within 10 nm from a two-dimensional Euclidian plane that includes an interface between the semiconductor channel 40 and the ferroelectric memory element 21.

The transistor 95 of the first exemplary structure 180 can be formed, for example, by forming the semiconductor channel 40 over a substrate 10, by forming the ferroelectric memory element 21 directly on the first surface of the semiconductor channel 40, by forming the conductive gate electrode 51 on the ferroelectric memory element 21, by forming the source contact 42 on the first portion of the semiconductor channel 40, and by forming the drain contact 44 on the second portion of the semiconductor channel 40. The substrate 10 has a planar top surface 11 that contacts a bottom surface of the semiconductor channel 40. In the embodiment shown in FIG. 7, the direction between the semiconductor channel 40 and the conductive gate electrode 51 is normal to the planar top surface 11 of the substrate 10. Alternatively, in the embodiment shown in FIG. 8, the transistor 95 may be rotated 90 degrees with respect to the transistor 95 shown in FIG. 7 such that the direction between the semiconductor channel 40 and the conductive gate electrode 51 is parallel to the plane of the planar top surface 11 of the substrate 10. The substrate 10 may comprise any suitable supporting substrate, such as a semiconductor wafer, an insulating substrate or a conductive substrate containing an insulating layer over its planar top surface 11.

During programming, a variable gate bias voltage $V_g$ can be applied to the conductive gate electrode 51 relative to the semiconductor channel 40 to program the polarization of the ferroelectric memory element 21. During sensing, a source-drain bias voltage is applied between (e.g., across) the source contact 42 and the drain contact 44 and by applying a gate sensing bias voltage to the conductive gate electrode 51. A sense circuitry 584 can measure the source-drain current while applying the source-drain bias voltage between (e.g., across) the source contact 42 and the drain contact 44.

Figure 8:
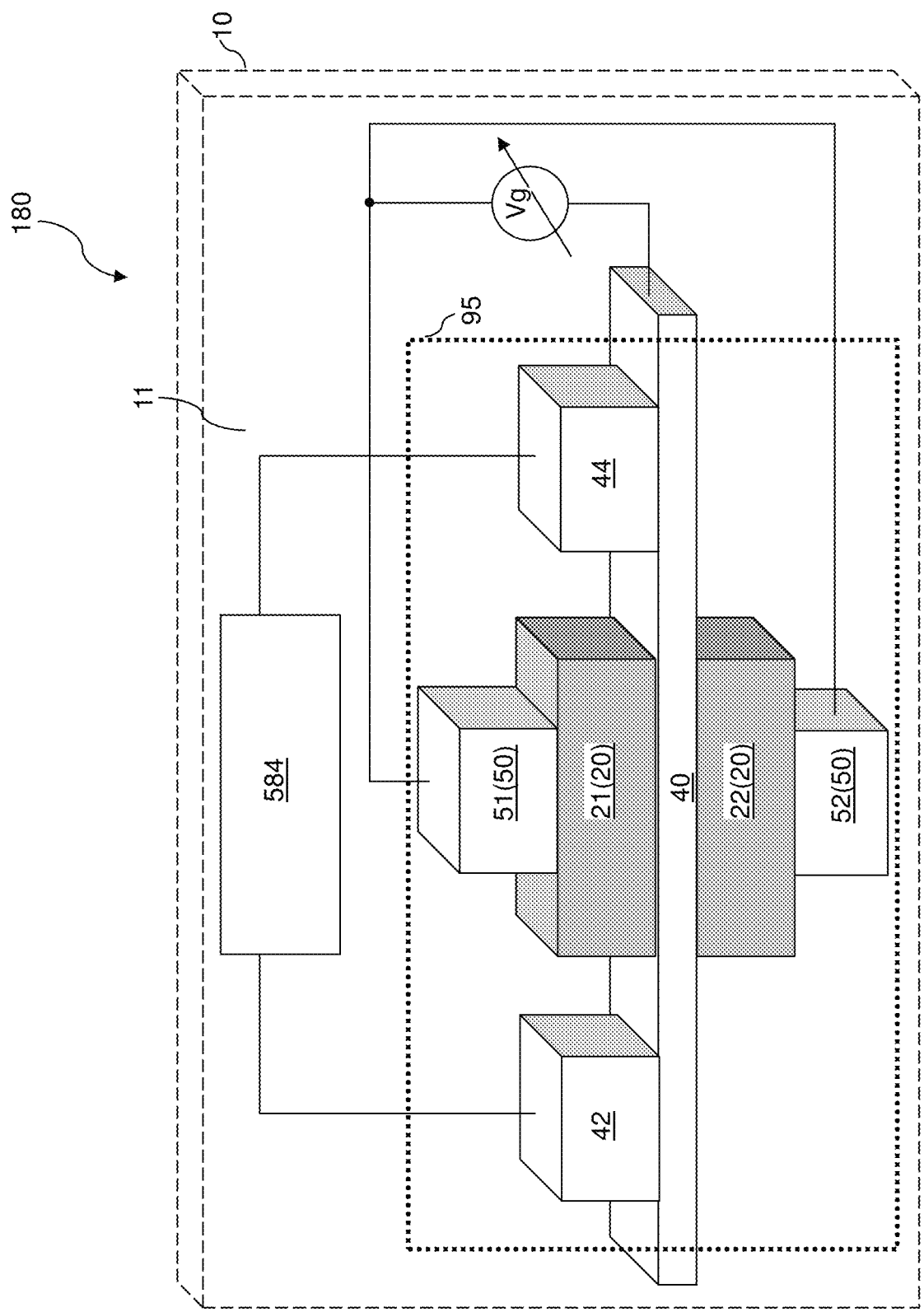
FIG. 8 is a second exemplary structure according to a second embodiment of the present disclosure.

Referring to FIG. 8, a second exemplary structure 180 according to a second embodiment of the present disclosure can be derived from the first exemplary structure 180 of FIG. 7 by providing a backside ferroelectric memory element 22 in contact with a second surface of the semiconductor channel 40. The backside ferroelectric memory element 22 is an additional ferroelectric material portion that functions as an additional gate dielectric 20. The backside ferroelectric memory element 22 is located on a second surface of the semiconductor channel 40, which is parallel to the first surface of the semiconductor channel 40 and is located on the opposite side of the first surface of the semiconductor channel 40. The backside ferroelectric memory element 22 can have the same thickness as the ferroelectric memory element 21, and can include any ferroelectric material that can be employed for the ferroelectric memory element 21.

A conductive backside gate electrode 52 is provided on the backside ferroelectric memory element 22. The conductive backside gate electrode 52 can be in contact with the backside ferroelectric memory element 22. The conductive backside gate electrode 52 can include any material that can be employed for the conductive gate electrode 51. An electrically conductive path connecting the conductive backside gate electrode and the conductive gate electrode, thereby electrically shorting the conductive backside gate electrode 52 to the conductive gate electrode 51.

In one embodiment, the polarization of the ferroelectric memory element 21 and the polarization of the backside ferroelectric memory element 22 can point in opposite directions. Thus, the polarization of the ferroelectric memory element 21 and the polarization of the backside ferroelectric memory element 22 can point toward the semiconductor channel 40 in a first ferroelectric memory state, and the polarization of the ferroelectric memory element 21 and the polarization of the backside ferroelectric memory element 22 can point away from the semiconductor channel 40 in a second ferroelectric memory state. Thus, positive ferroelectric charges are present in the ferroelectric memory element 21 and the backside ferroelectric memory element 22 near the interfaces with the semiconductor channel 40 in the first ferroelectric memory state, which induces negative screening charges (mobile electrons) in the two-dimensional charge carrier gas layer near the interfaces with the ferroelectric memory element 21 and the backside ferroelectric memory element 22. Alternatively, if a semiconducting layer is used instead of a two-dimensional charge carrier gas layer, the induced charges will act to shift the Fermi energy and change the conductive state of the semiconducting layer. Likewise, negative ferroelectric charges are present in the ferroelectric memory element 21 and the backside ferroelectric memory element 22 near the interfaces with the semiconductor channel 40 in the second ferroelectric memory state, which induces positive screening charges (holes, i.e., absence of elections) in the two-dimensional charge carrier gas layer near the interfaces with the ferroelectric memory element 21 and the backside ferroelectric memory element 22. The second exemplary structure 180 can be operated by applying the same voltage (e.g., the same polarity voltage pulses) to the conductive backside gate electrode 52 as the voltage applied to the front side conductive gate electrode 51.

The thickness of the semiconductor channel 40 in the second exemplary structure 180 can be the same as the thickness of the semiconductor channel in the first exemplary structure 180. Alternatively, the thickness of the semiconductor channel 40 in the second exemplary structure 180 can be in a range from 1.0 times the thickness of the semiconductor channel 40 in the first exemplary structure 180 to 2.0 times the thickness of the semiconductor channel in the first exemplary structure 180. The increased thickness window for the semiconductor channel 40 in the second exemplary structure 180 is due to the dual gate configuration in which the screening charges are induced from two different ferroelectric polarizations in an additive manner.

The transistor 95 of the second exemplary structure 180 can be formed by modifying the method for forming the transistor 95 of the first exemplary structure 180. In addition to the processing steps employed to form the various components of the first exemplary structure 180, the backside ferroelectric memory element 22 can be formed on the second surface of the semiconductor channel 40, and the conductive backside gate electrode 52 can be formed on the backside ferroelectric memory element 22.

In one embodiment, the transistor 95 of the second exemplary structure 180 may be supported by the substrate 10 having the planar top surface 11 that is perpendicular to the plane of the interface between the semiconductor channel 40 and the ferroelectric memory element 21 and is parallel to the direction of the electrical current in the semiconductor channel 40 during a sensing operation, i.e., the direction between the source contact 42 and the drain contact 44.

Alternatively, the transistor 95 shown in FIG. 8 may be rotated by 90 degrees to have configuration similar to that shown in FIG. 7. In this alternative configuration, the conductive backside gate electrode 52 is formed over the substrate 10, the backside ferroelectric memory element 22 is formed over the conductive backside gate electrode 52, the semiconductor channel 40 is formed over the backside ferroelectric memory element 22, the ferroelectric memory element 21, the source contact 42 and the drain contact 44 are formed over the semiconductor channel 40, and the front side conductive gate electrode 51 is formed over the ferroelectric memory element 21.

Figure 9:
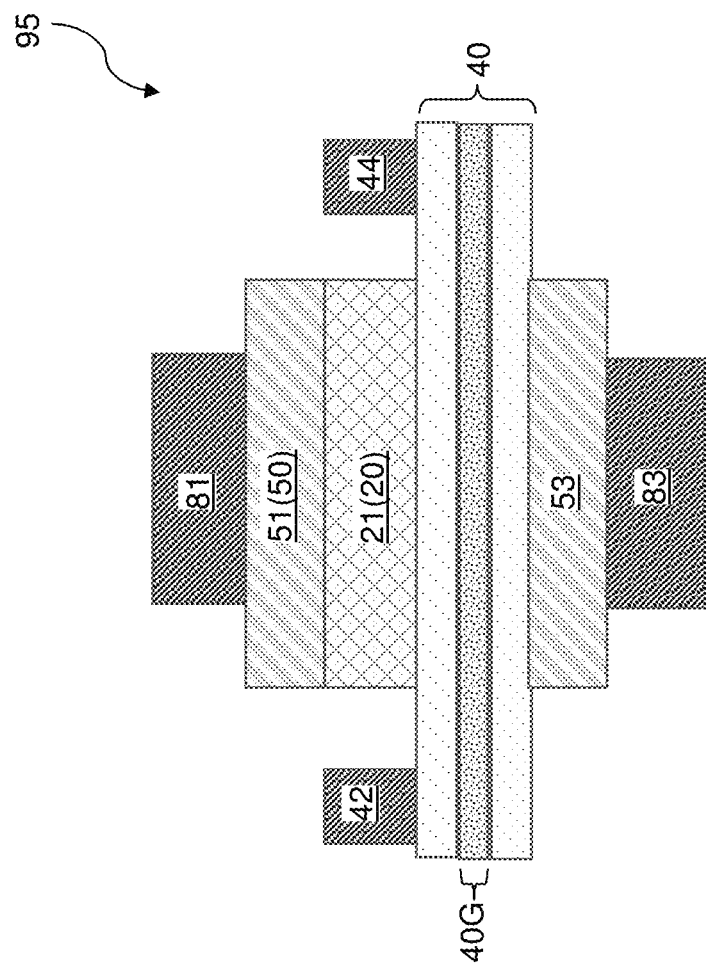
FIG. 9 is a third exemplary structure according to a third embodiment of the present disclosure.

Referring to FIG. 9, a transistor 95 of a third exemplary structure according to an embodiment of the present disclosure is illustrated, which can be derived from the first exemplary structure 180 by forming a backside contact electrode 53 directly on the second surface of the semiconductor channel 40. A two-dimensional semiconductor material layer 40G within the semiconductor channel 40 is expressly illustrated. A described above, the two-dimensional semiconductor material layer 40G may comprise the entire semiconductor channel 40 or just a portion of the semiconductor channel 40. The two-dimensional semiconductor material layer 40G can have a band gap of at least 1.1 eV, can include a thickness of 1 to 5 monolayers of the atoms of the semiconductor material and/or can include a two-dimensional charge carrier gas layer. The second surface of the semiconductor channel 40 is located on the opposite side of the first surface of the semiconductor channel 40. Thus, the backside contact electrode 53 can be in contact with the second surface of the semiconductor channel 40. The backside contact electrode 53 can apply a backside bias voltage to the semiconductor channel 40 during programming of the ferroelectric polarization of the ferroelectric memory element 21. Optionally, a front gate contact 81 and/or a back gate contact 83 may be formed on the conductive gate electrode 51 and on the backside contact electrode 53, respectively, to facilitate application of bias voltages that are employed during operation of the transistor 95 of the third exemplary structure. In an alternative embodiment, layers 51 and/or 53 illustrated in FIG. 9 may comprise gate insulating layers and contacts 81 and/or 83 may comprise the front side conductive gate electrode and the backside contact electrode (e.g., a back gate), respectively.

Figure 10A:
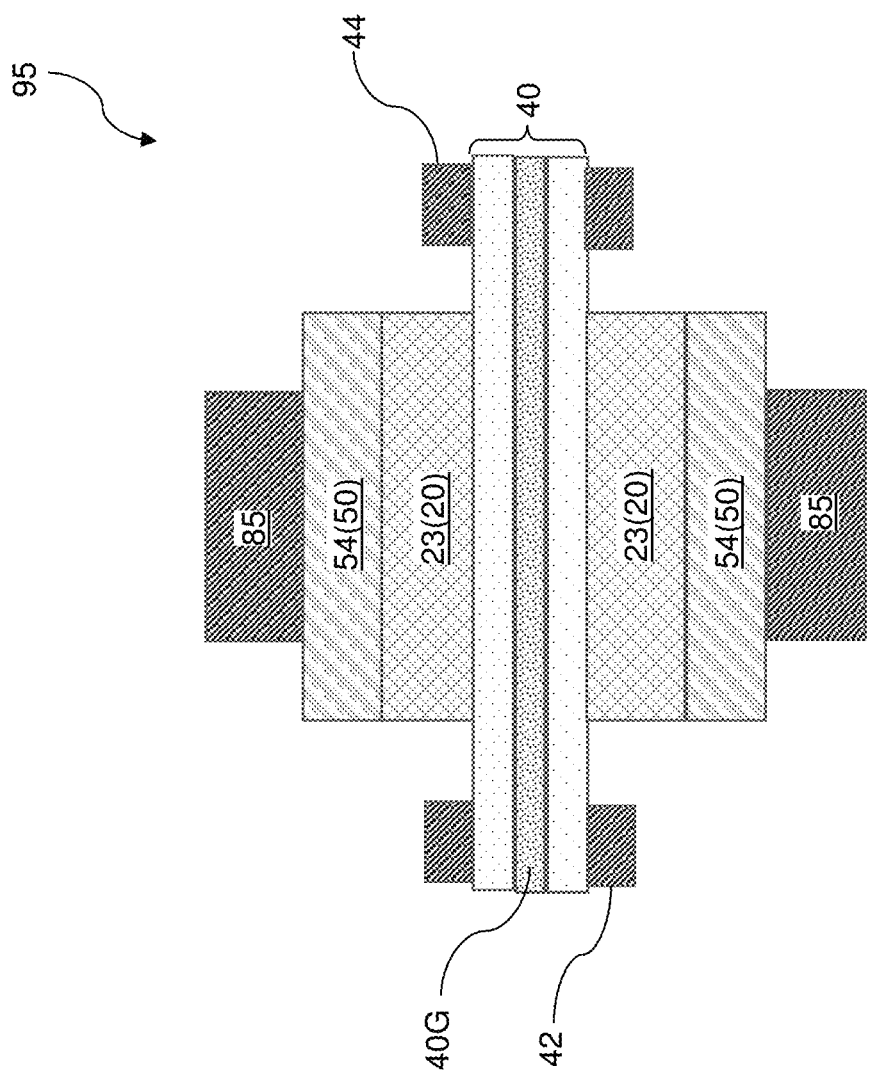
FIG. 10A is vertical cross-sectional view of a fourth exemplary structure according to a fourth embodiment of the present disclosure.
Figure 10B:
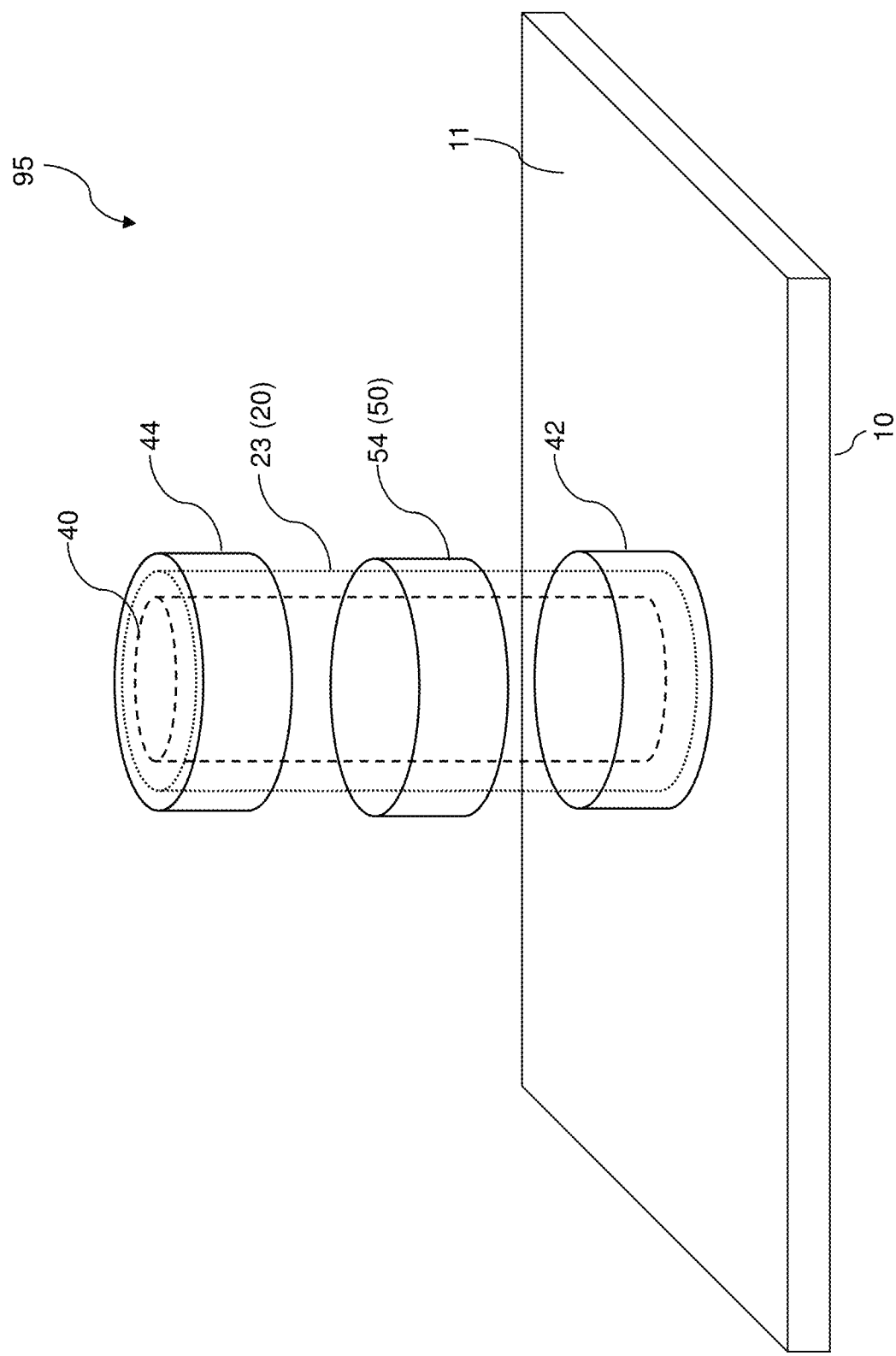
FIG. 10B is schematic see-through perspective view of the fourth exemplary structure of FIG. 10A.

Referring to FIGS. 10A and 10B, a transistor 95 of a fourth exemplary structure according to a fourth embodiment of the present disclosure is illustrated. In the transistor 95 of the fourth exemplary structure, the ferroelectric memory element 20 and/or the gate electrode 50 can have a tubular configuration which surrounds the semiconductor channel 40. In other words, the gate electrode 50 may be a wrap gate electrode 54 which wraps around the ferroelectric memory element 20 which may be a wrap around ferroelectric memory element 23. The wrap around ferroelectric memory element 23 wraps around (i.e., surrounds) the semiconductor channel 40.

In this embodiment, the semiconductor channel 40 may be a vertical pillar or a vertical shell which surrounds a vertical pillar which extends lengthwise perpendicular to the planar top surface 11 of the substrate 10, as shown in FIG. 10B. The wrap around ferroelectric memory element 23 may be an inner shell which wraps around (i.e., surrounds) the semiconductor channel 40. The wrap gate electrode 54 wraps around the middle portion of the wrap around ferroelectric memory element 23. The source and drain contacts (42, 44) contact opposite ends of the semiconductor channel 40 on opposite sides of the wrap gate electrode 54. The source and drain contacts (42, 44) may also wrap around the semiconductor channel 40 or they may contact only a portion of the outer perimeter of the semiconductor channel 40.

Generally, the various ferroelectric memory devices 180 of the embodiments of the present disclosure can be operated by programming a polarization direction of the ferroelectric memory element 21 by applying a positive bias voltage or a negative bias voltage to the conductive gate electrode 51 with respective to the semiconductor channel 40, and by sensing the polarization direction of the ferroelectric memory element 21 by measuring a magnitude of electrical current between the source contact 42 and the drain contact 44 while applying a read voltage (i.e., a measurement bias voltage) between the source contact 42 and the drain contact 44. If a backside ferroelectric memory element 22 is included, then the ferroelectric polarization direction of the backside ferroelectric memory element 22 is opposite of the ferroelectric polarization direction of the ferroelectric memory element 21. The thickness and/or the material composition of the backside ferroelectric memory element 22 may be the same as, or may be different from, the thickness and/or the material composition of the ferroelectric memory element 21. In other words, the polarization of the ferroelectric memory element 21 and the backside ferroelectric memory element 22 are antiparallel to each other, and are flipped simultaneously during programming.

If a conductive backside gate electrode 52 is included, then the voltage applied to the conductive backside gate electrode 52 can be the same as the voltage applied to the front side conductive gate electrode 51. A read voltage can be applied to the conductive gate electrode 51 while sensing the polarization direction of the ferroelectric memory element 21 and optionally sensing the polarization direction of the backside ferroelectric memory element 22.

The device of the embodiments of the present disclosure provides advantages over ferroelectric-pristine graphene memory elements based on tunneling electroresistance (TER) which have poor polarization retention and which require thick ferroelectric barriers to stabilize polarization. However the thick barriers lead to low tunneling currents and therefore strongly reduce the signal (e.g., reading current) in TER-based devices. In contrast, reading current does not flow through the ferroelectric material in devices of the embodiments of the present disclosure. Thus, a much thicker ferroelectric layer can be used in the device of the embodiments of the present disclosure compared to prior art TER-based devices without reducing the reading current, and the problem of polarization retention is reduced or overcome in the devices of the embodiments of the present disclosure.

Without wishing to be bound by a particular theory and in order to demonstrate advantages of the device of the embodiments of the present disclosure, the inventors calculated a ferroelectric polarization controlled on-off ratio on the semiconductor's band gap in finite size nanostructures at room temperature. The inventors developed quantum mechanical calculations of electrical conductivity based on the ballistic electron transport through finite size semiconductor attached to ferroelectric material and two metallic contacts. The inventors' calculations are based on the Green Function formalism within a two-band tight binding Hamiltonian model. In contrast, first principles electronic structure calculations were used to obtain the density of states and band gaps of two-dimensional semiconductor materials.

Specifically, the structure of FIG. 1 was modeled with a rectangular device size of 10 nm×5 nm (i.e., the area of each interface between adjacent layers). The thickness d of the ferroelectric material portion was 5 nm, and the distance between the ferroelectric material portion and each metallic contact was 1 nm. The electrostatic potential in the semiconductor material portion underneath the ferroelectric material portion was controlled by reversing ferroelectric polarization.

The results of the inventors' simulations are illustrated in FIGS. 11, 12, and 13A-13D. The accuracy of the conductivity simulations was limited by the numerical precision. The values of conductivity below $10^{-2}$ (Ohm·m)$^{-1}$ are outside the range of reliable numerical accuracy, and therefore, the calculations were limited to the range of ferroelectric polarization leading to conductivity values of at least $10^{-2}$ (Ohm·m)$^{-1}$.

Figure 11:
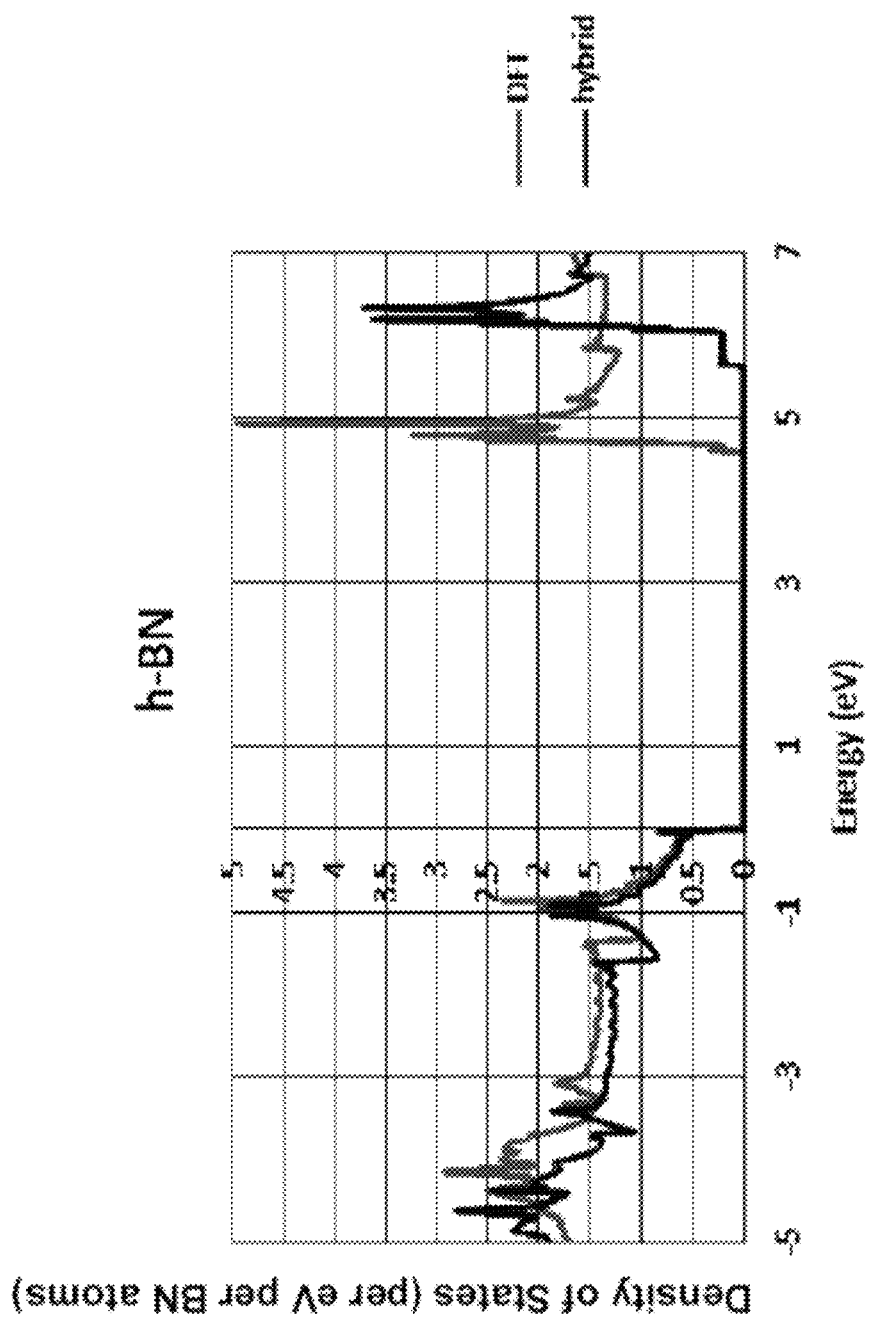
FIG. 11 illustrates calculated density of states per eV per atom for hexagonal boron nitride according to the density function theory (DFT) and the hybrid functional.

Referring to FIG. 11, calculated density of states per eV per atom is shown for hexagonal boron nitride. This calculation was based on the density function theory (DFT) and the hybrid functional.

Figure 12:
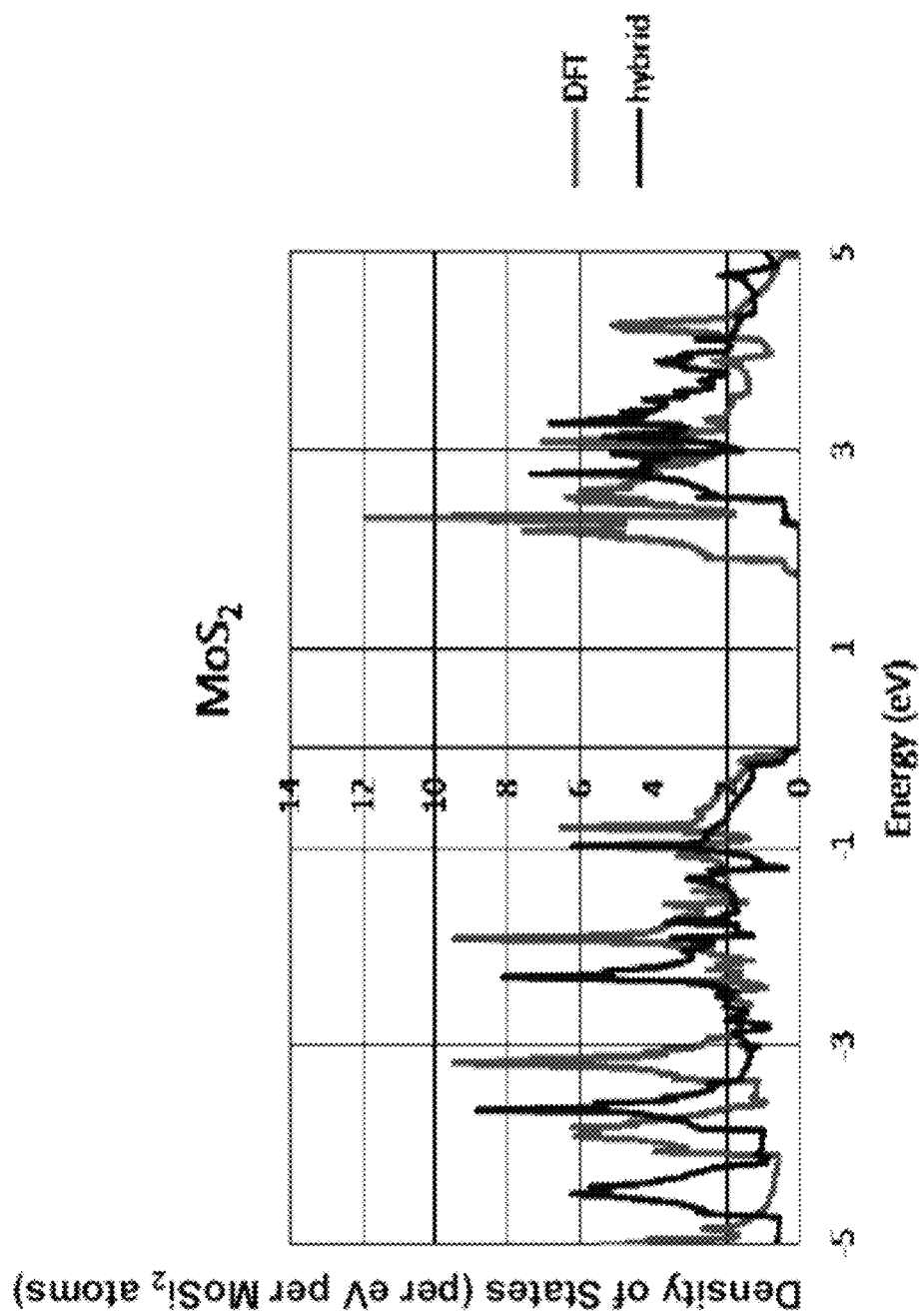
FIG. 12 illustrates calculated density of states per eV per atom for molybdenum disulfide according to the density function theory (DFT) and the hybrid functional.

Referring to FIG. 12, calculated density of states per eV per atom is shown for molybdenum disulfide. This calculation was based on the density function theory (DFT) and the hybrid functional.

Figure 13A:
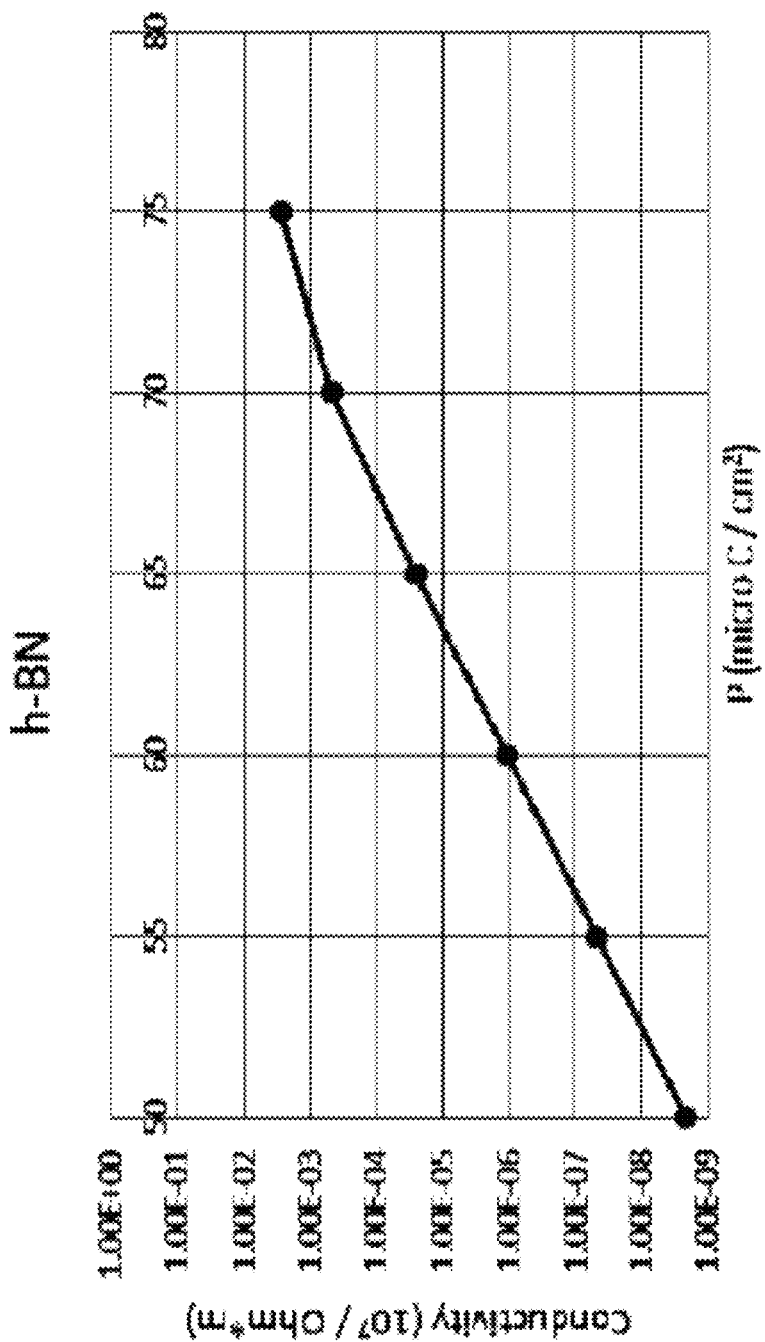
FIG. 13A is a graph of electrical conductivity for hexagonal boron nitride as a function of polarization calculated within the tight binding model.
Figure 13B:
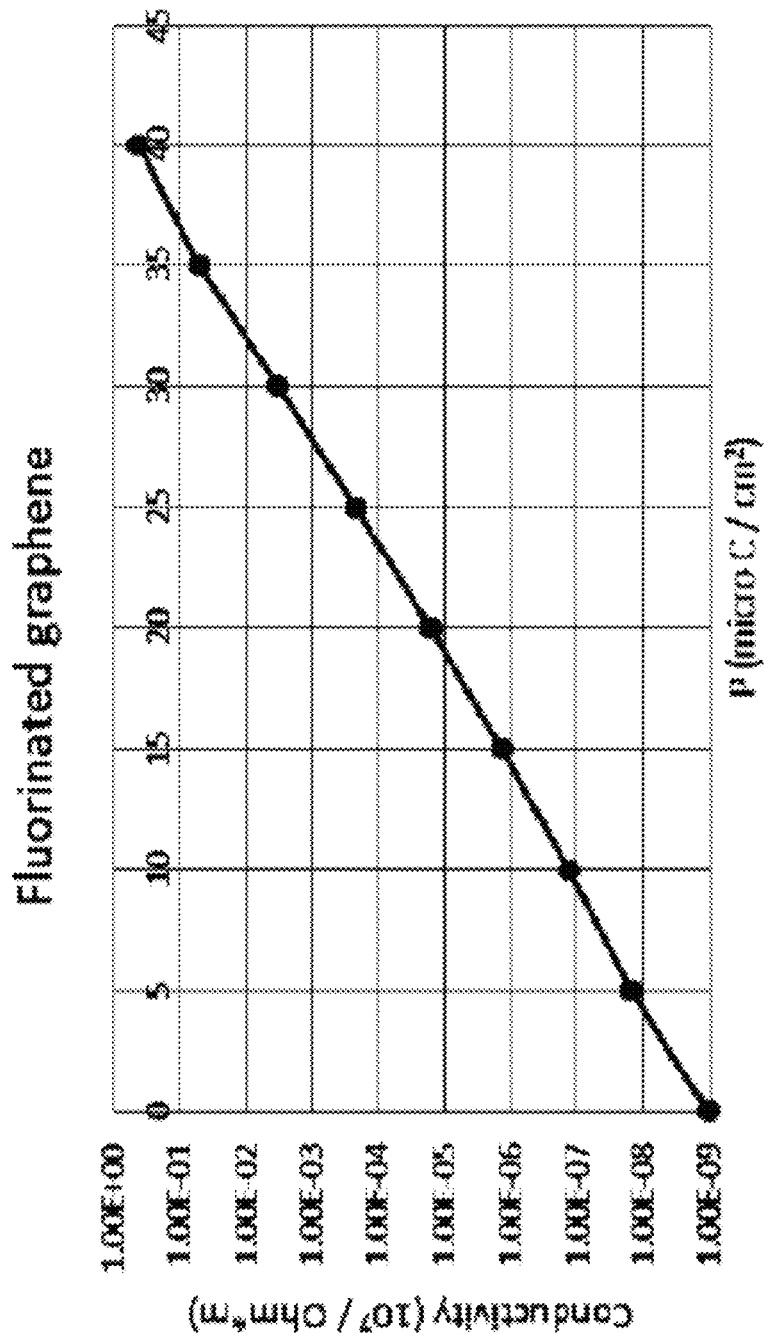
FIG. 13B is a graph of electrical conductivity for fluorinated graphene as a function of polarization calculated within the tight binding model.
Figure 13C:
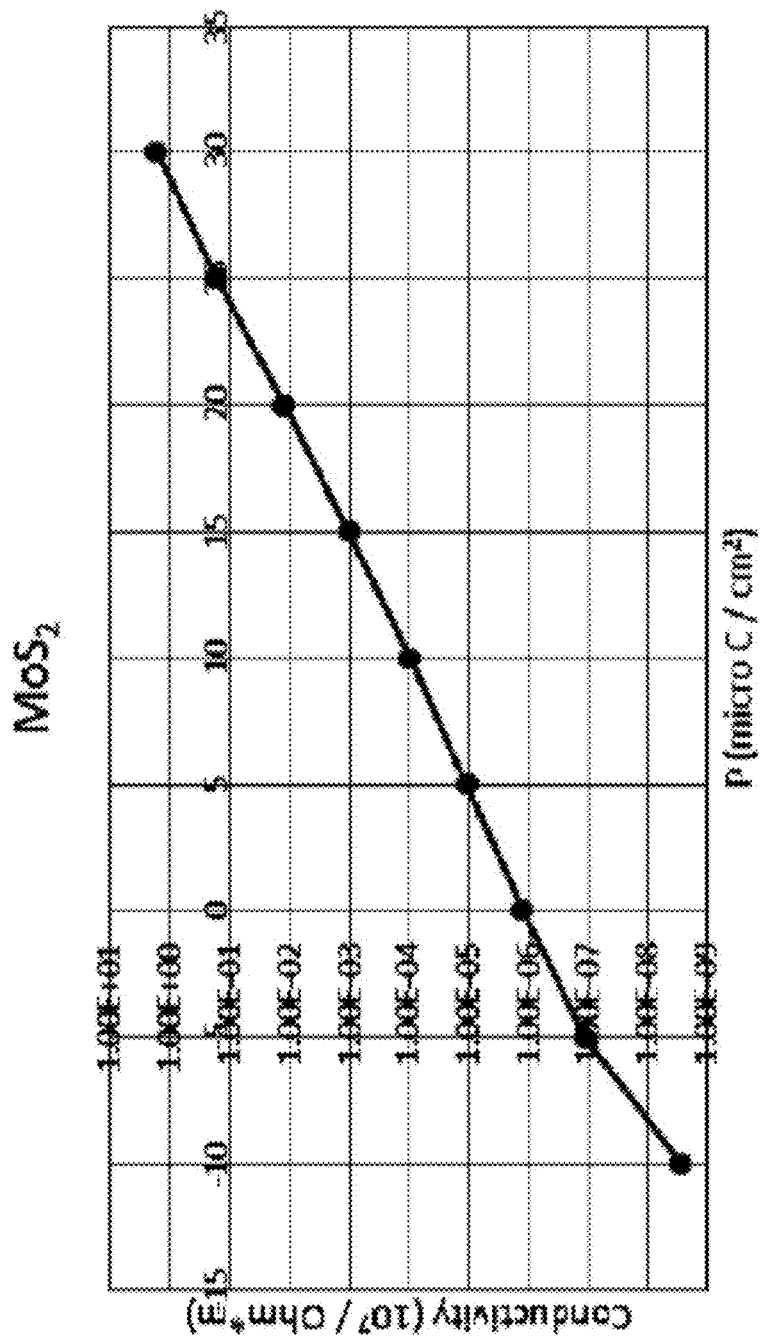
FIG. 13C is a graph of electrical conductivity for molybdenum disulfide as a function of polarization calculated within the tight binding model.
Figure 13D:
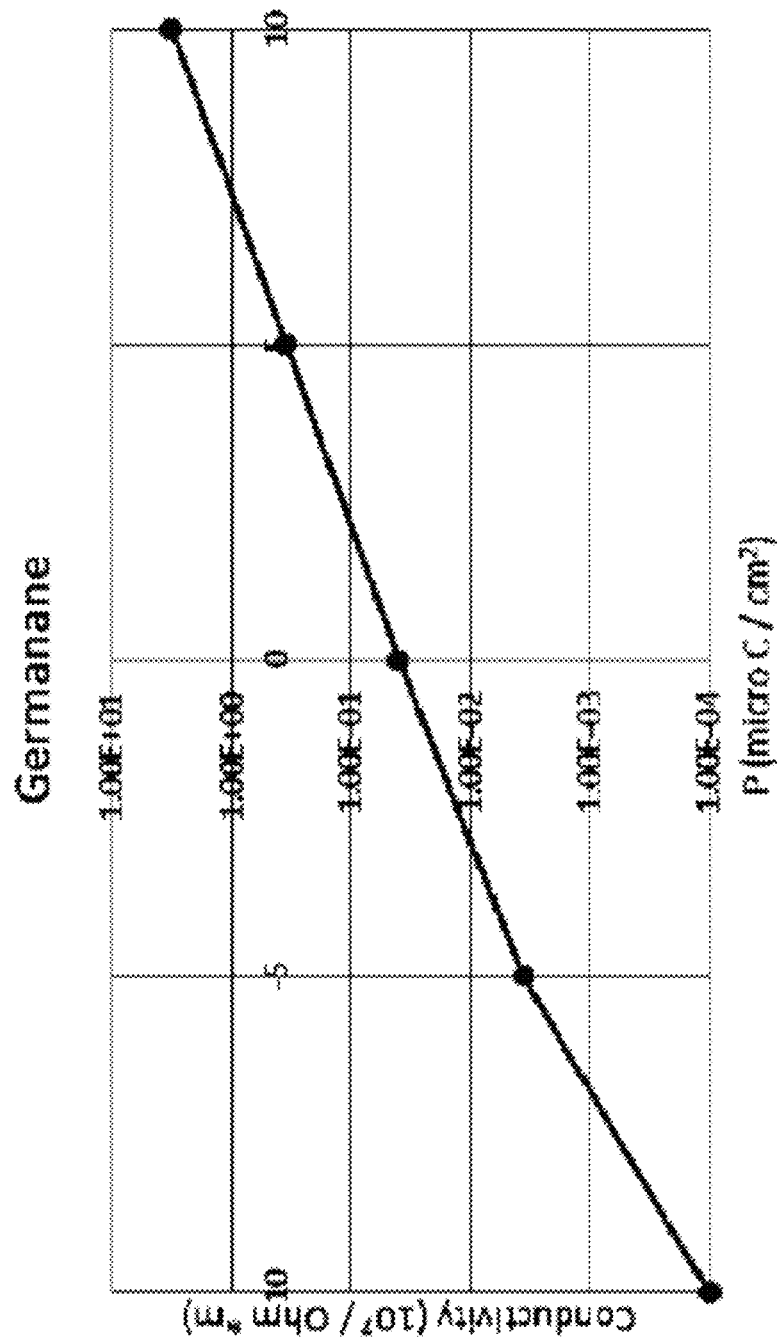
FIG. 13D is a graph of electrical conductivity for germanane as a function of polarization calculated within the tight binding model.

FIGS. 13A-13D show graphs for the calculated electrical conductivity (in units of $10^7$/Ohm·m) for the transistor 95 of the ferroelectric memory device of the embodiments of the present disclosure at room temperature (20 degrees Celsius) as a function of ferroelectric polarization. FIG. 13A shows the calculated electrical conductivity for the case in which the ferroelectric memory element consists of hexagonal boron nitride. FIG. 13B shows the calculated electrical conductivity for the case in which the ferroelectric memory element consists of fluorinated graphene. FIG. 13C shows the calculated electrical conductivity for the case in which the ferroelectric memory element consists of molybdenum disilicide. FIG. 13D shows the calculated electrical conductivity for the case in which the ferroelectric memory element consists of germanane.

FIGS. 13A-13D show that conductivities of all semiconductor channels of the embodiments of the present disclosure exponentially increases (or decreases) with ferroelectric polarization for positive (or negative) direction of ferroelectric polarization. This allows fitting the calculated conductivity $\sigma(P)$ to a fitting function including the ferroelectric polarization P as a variable. Further, the on-off ratio ON/OFF (i.e., the ratio of the conductivity in the on state to the conductivity in the off state) can be fitted to another fitting function having another variable $P_{max}$, which is the maximum value of ferroelectric polarization required to push the Fermi level of a two-dimensional semiconductor into the conduction band. The functional forms for $\sigma(P)$ and ON/OFF are given by:

$$\sigma(P) = \sigma_0 e^{aP}, \text{ and}$$

$$ON/OFF = e^{2aP_{max}},$$

in which where $\sigma_0 = \sigma(P=0)$ is the conductivity of a semiconductor channel for the paraelectric case. Table 3 tabulates best fit values for the fitting parameters for $\sigma(P)$ and ON/OFF.

TABLE 3 fitting parameters for ferroelectric materials

| Ferroelectric material | Optimum value for a (in cm²/μC) | $P_{max}$ (in μC/cm²) |
|---|---|---|
| Hexagonal BN | 0.61 | 75 |
| MoSi$_2$ | 0.49 | 30 |
| Fluorinated graphene | 0.50 | 40 |
| germanane | 0.44 | 10 |

While defect states may limit the value for the ON/OFF ratio in practice, the various two-dimensional semiconductor materials provide generally high ON/OFF ratio. The simulations show that higher ON/OFF ratios are possible with wider band gaps two-dimensional semiconductor materials and a thicker ferroelectric material can be used in conjunction with such two-dimensional semiconductor materials. A higher operating voltage is expected with an increase in the thickness of the ferroelectric material in the ferroelectric memory device 180 of the embodiments of the present disclosure.

Figure 14:
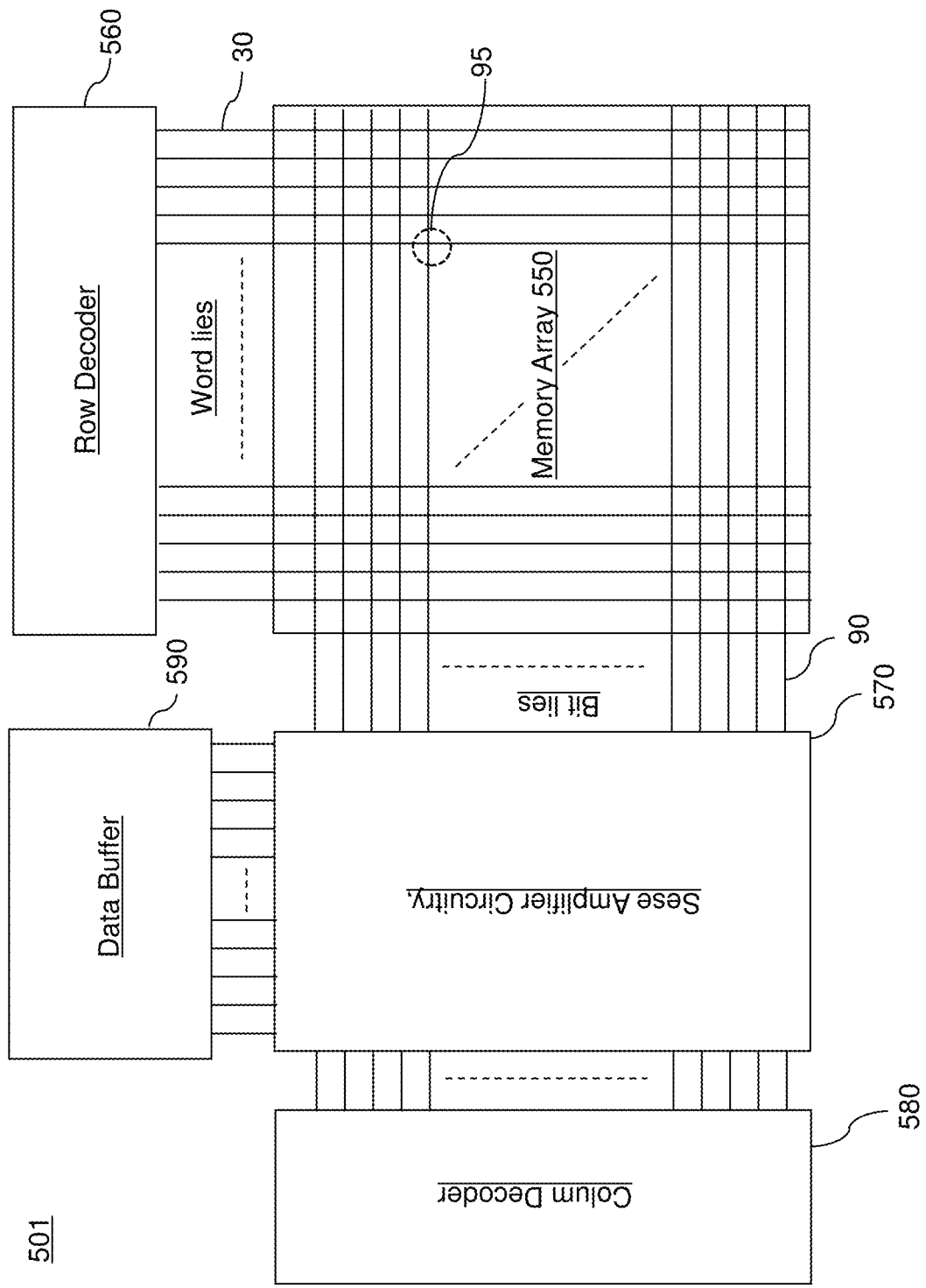
FIG. 14 is a schematic diagram of a ferroelectric memory device according to an embodiment of the present disclosure.

According to an aspect of the present disclosure, a ferroelectric memory array can include an array of memory cells (e.g., transistors) 95 of the embodiments of the present disclosure. Referring to FIG. 14, a schematic diagram is shown for a ferroelectric memory array including the transistors 95 in an array configuration. The ferroelectric memory array can be configured as a random access memory device 501. As used herein, a "random access memory device" refers to a memory device including memory cells that allow random access, i.e., access to any selected memory cell upon a command for reading the contents of the selected memory cell.

The random access memory device 501 of the present disclosure includes a memory array region 550 containing an array of the respective ferroelectric memory cells 180 located at the intersections of word lines (which may comprise first electrically conductive lines 30 as illustrated or as second electrically conductive lines 90 in an alternate configuration) and bit lines (which may comprise second electrically conductive lines 90 as illustrated or as first electrically conductive lines 30 in an alternate configuration). For example, the word lines 30 may be electrically connected to and/or may comprise the gate electrodes 50 of the transistors 95 in the array, while the bit lines 90 may be electrically connected to and/or may comprise the source or drain contacts (42, 44) of the transistors 95 in the array.

The random access memory device 501 may also contain a row decoder 560 connected to the word lines, a sense circuitry 570 (e.g., a sense amplifier and other bit line control circuitry) connected to the bit lines, a column decoder 580 connected to the bit lines, and a data buffer 590 connected to the sense circuitry. Multiple instances of the ferroelectric memory cells (e.g., ferroelectric memory transistors) 95 are provided in an array configuration that forms the random access memory device 501. As such, each of the ferroelectric memory cells 95 can be a two-terminal device including a respective first electrode and a respective second electrode. It should be noted that the location and interconnection of elements are schematic and the elements may be arranged in a different configuration. Further, a ferroelectric memory cell 95 may be manufactured as a discrete device, i.e., a single isolated device.

The embodiments of the present disclosure provide a nonvolatile memory element based on ferroelectric-controlled electrical conductivity of a two-dimensional semiconductor material, or a two-dimensional charge carrier gas layer, such as a 2DEG layer 40G. Information can be written and stored by applying electric pulses that reverse the ferroelectric polarization and thereby induce surface charges in the semiconductor or in the two-dimensional charge carrier gas layer. Information can be read by measuring the resistance of a semiconductor channel including the two-dimensional charge carrier gas layer.

The device of the embodiments of the present disclosure provides significant increase in the difference in electrical resistance of two-dimensional semiconductor material layer compared to previously known three-terminal ferroelectric-graphene structures by replacing gapless pristine graphene (i.e., a band gap of zero) with two-dimensional semiconductor material layer, which can have a band gap of at least 1.1 eV. The device of the embodiments of the present disclosure can strongly improve the stability of ferroelectric polarization compared to previously known two-terminal perpendicular tunnel junction devices because the thickness of a ferroelectric material portion can be increased without signal loss. The device of the embodiments present disclosure is a non-volatile memory device enabling non-volatile storage of information, which is not provided by high-electron-mobility transistors (HEMTs) or heterojunction field effect transistors (HFETs) known in the art. The device of the embodiments of the present disclosure enables low power sensing because the in-plane geometry allows low-current operation during the sensing step.

Figure 15B:
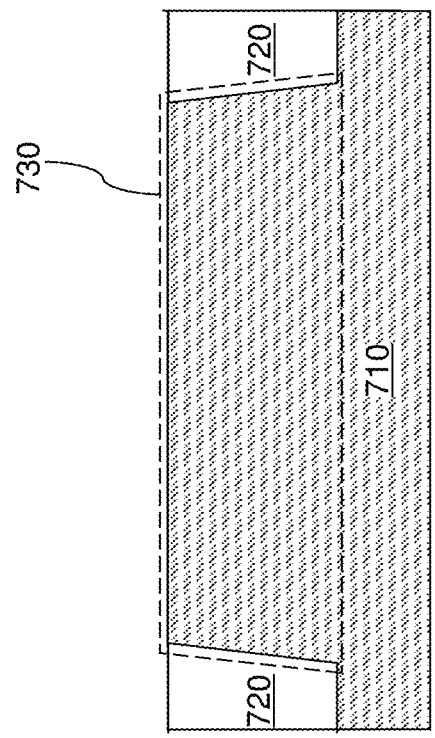
FIG. 15B is a vertical cross-sectional view along the vertical plane B-B' of FIG. 15A.
Figure 15A:
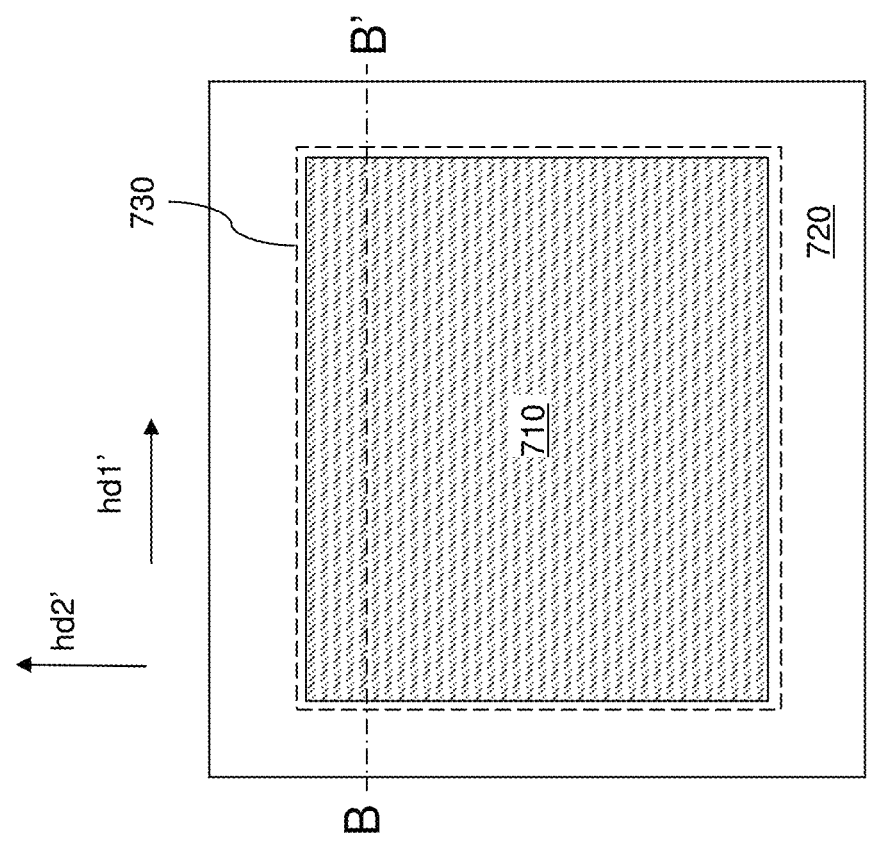
FIG. 15A is a top-down view of a fifth exemplary structure after formation of a shallow trench isolation structure according to a fifth embodiment of the present disclosure.

Referring to FIGS. 15A and 15B, a fifth exemplary structure according to a fifth embodiment of the present disclosure is illustrated, which includes a semiconductor substrate including a semiconductor material layer 710. The semiconductor substrate may be a bulk semiconductor substrate in which the semiconductor material layer 710 extends from a front surface to a backside surface, or may be a semiconductor-on-insulator (SOI) substrate including a buried insulator layer (not shown) underlying the semiconductor material layer 710 and a handle substrate (not shown) that underlies the buried insulating layer. For example, the semiconductor substrate may comprise a commercially available single crystalline bulk silicon wafer or a commercially available semiconductor-on-insulator substrate.

The semiconductor material layer 710 can include a single crystalline semiconductor material or a polycrystalline semiconductor material. The semiconductor material layer 710 may comprise a doped well in a silicon wafer, a top portion of the silicon wafer, or a semiconductor film deposited over any suitable substrate. In one embodiment, the entirety of the semiconductor material layer 710 can include a single crystalline semiconductor material such as single crystalline silicon. The semiconductor material of the semiconductor material layer 710 have a doping of a first conductivity type, which may be p-type or n-type. The atomic concentration of dopants of the first conductivity type in the semiconductor material layer 710 may be in a range from $1.0 \times 10^{14}/cm^3$ to $3.0 \times 10^{17}/cm^3$, although lesser and greater atomic concentrations may also be employed. In one embodiment, the semiconductor material layer 710 can consist essentially of silicon and dopants of the first conductivity type.

In an alternative embodiment, the semiconductor material layer 710 may comprise the two-dimensional semiconductor material described above with respect to the first through fourth embodiments. For example, the semiconductor material layer may comprise a metal dichalcogenide (e.g., $MoS_2$) material having a thickness of 1 to 5 monolayers (e.g., 0.6 nm to 4 nm). In another alternative embodiment, an organic semiconductor material layer or a wide band gap metal oxide semiconductor material layer (e.g., zinc oxide or titanium dioxide) may be used instead.

Shallow trench isolation structures 720 can be formed in an upper portion of the semiconductor material layer 710. For example, shallow trenches can be formed through the top surface of the semiconductor material layer 710 by applying and patterning a photoresist layer over the top surface of the semiconductor material layer 710, and by transferring the pattern in the photoresist layer into the upper portion of the semiconductor material layer 710 employing an anisotropic etch process. The photoresist layer can be subsequently removed, for example, by ashing. A dielectric material can be deposited in the shallow trenches, and excess portions of the dielectric can be removed from above the horizontal plane including the top surface of the semiconductor material layer 710 employing a planarization process such as a chemical mechanical polishing (CMP) process. The remaining portions of the dielectric material that fill the shallow trenches comprise the shallow trench isolation structures 720. The shallow trench isolation structures 720 can laterally surround device regions 730, one of which is illustrated in FIGS. 15A and 15B. In one embodiment, each device region can be laterally surrounded by a shallow trench isolation structure 720. In one embodiment, at least one of the device regions can have a rectangular horizontal cross-sectional shape having a pair of first edges that laterally extend along a first horizontal direction hd1' and a pair of second edges that laterally extend along a second horizontal direction hd2'. While the present disclosure is described employing a single device region, it is understood that multiple device regions laterally surrounded by a respective shallow trench isolation structure 720 can be formed in the first exemplary structure.

The area of each device region 730 can be defined by the bottom edge of the inner periphery of a shallow trench isolation structure 720 that laterally surrounds a portion of the semiconductor material layer 710. In one embodiment, a device region 730 can have a rectangular horizontal cross-sectional shape, and can have a pair of first straight edges that are parallel to the first horizontal direction hd1', and a pair of second straight edges that are parallel to the second horizontal direction hd2'.

Figures 16A, 16B:
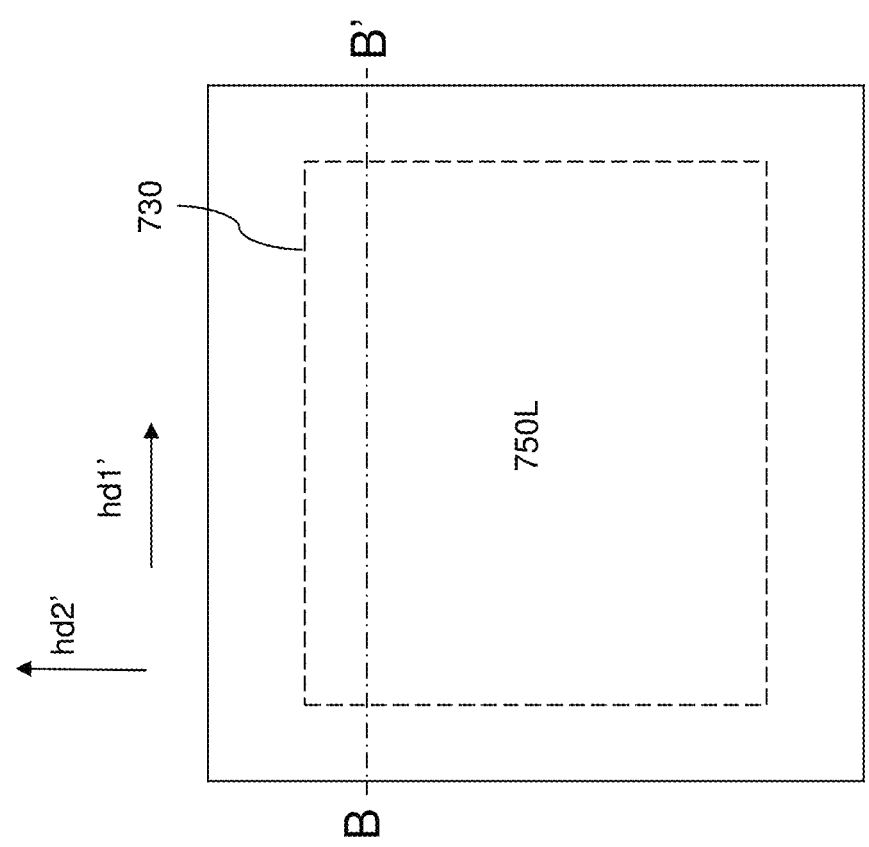
FIG. 16A is a top-down view of a fifth exemplary structure after formation of a ferroelectric gate dielectric layer according to the fifth embodiment of the present disclosure.
FIG. 16B is a vertical cross-sectional view along the vertical plane B-B' of FIG. 16A.

Referring to FIGS. 16A and 16B, a ferroelectric material can be deposited on the top surface of the semiconductor material layer 710 and over the shallow trench isolation structure 720 to form a ferroelectric gate dielectric layer 750L. The ferroelectric gate dielectric layer 750L can include any ferroelectric material that can be employed for the ferroelectric memory element 21 described above. The ferroelectric gate dielectric layer 750L includes, and/or consists essentially of, at least one ferroelectric material such as hafnium oxide (such as hafnium oxide containing at least one dopant selected from Al, Zr, and Si and having a ferroelectric non-centrosymmetric orthorhombic phase), zirconium oxide, hafnium-zirconium oxide, barium titanate (such as $BaTiO_3$; BT), colemanite (such as $Ca_2B_6O_{11}.5H_2O$), bismuth titanate (such as $BiuTiO_{20}$, $Bi_4Ti_3O_{12}$ or $Bi_2Ti_2O_7$), europium barium titanate, ferroelectric polymer, germanium telluride, langbeinite (such as $M_2M'_2(SO_4)_3$ in which M is a monovalent metal and M' is a divalent metal), lead scandium tantalate (such as $Pb(Sc_xTa_{1-x})O_3$), lead titanate (such as $PbTiO_3$; PT), lead zirconate titanate (such as $Pb(Zr,Ti)O_3$; PZT), lithium niobate (such as $LiNbO_3$; LN), ($LaAlO_3$)), polyvinylidene fluoride $(CH_2CF_2)_n$, potassium niobate (such as $KNbO_3$), potassium sodium tartrate (such as $KNaC_4H_4O_6.4H_2O$), potassium titanyl phosphate (such as $KO_5PTi$), sodium bismuth titanate (such as $Na_{0.5}Bi_{0.5}TiO_3$ or $Bi_{0.5}Na_{0.5}TiO_3$), lithium tantalate (such as $LiTaO_3$ (LT)), lead lanthanum titanate (such as $(Pb,La)TiO_3$ (PLT)), lead lanthanum zirconate titanate (such as $(Pb,La)(Zr,Ti)O_3$ (PLZT)), ammonium dihydrogen phosphate (such as $NH_4H_2PO_4$ (ADP)), or potassium dihydrogen phosphate (such as $KH_2PO_4$ (KDP)). In one embodiment, the gate dielectric layer 750L comprises, and/or consists essentially of, a ferroelectric dielectric material. The ferroelectric gate dielectric layer 750L can be deposited by a conformal deposition process or a non-conformal deposition process. For example, the ferroelectric gate dielectric layer 750L can be formed by a chemical vapor deposition (CVD) process or an atomic layer deposition (ALD) process. The thickness of the ferroelectric gate dielectric layer 750L can be in a range from 4 nm to 30 nm, such as from 6 nm to 20 nm, although lesser and greater thicknesses can also be employed.

The ferroelectric gate dielectric layer 750L may include a plurality of different regions, such as two or more regions, which extend along the first horizontal direction hd1'. Referring to FIGS. 17A and 17B, in an illustrative example, the ferroelectric gate dielectric layer 750L includes four different regions (e.g., segments): a first segment 75A, a second segment 75B, a third segment 75C, and a fourth segment 75D. However, there may be two segments, three segments or more than four segments, such as five to ten segments for example. Each of the first segment 75A, the second segment 75B, the third segment 75C, and the fourth segment 75D can have a respective rectangular area. The sum of the areas of the first segment 75A, the second segment 75B, the third segment 75C, and the fourth segment 75D can be the same as the entire area of the device region 730. In the illustrative example, the first segment 75A, the second segment 75B, the third segment 75C, and the fourth segment 75D may be arranged from one side to another along the second horizontal direction hd2' and each extend in the first horizontal direction hd1' (i.e., have their longest horizontal dimension along the first horizontal direction).

In one embodiment, a focused ion beam (FIB) apparatus can be used to scan a focused ion beam along the first horizontal direction hd1' in one of the regions (e.g., segments) of the ferroelectric gate dielectric layer 750L, such as the first segment 75A. The focused ion beam has a sufficiently small first diameter at the point of impact on the ferroelectric gate dielectric layer 750L, such that only the first segment 75A is irradiated with the ion beam. For example, the diameter may be 10 nm to 20 nm wide at the point of impact, and the first segment 75A may have a width in the second horizontal direction hd2' of 10 nm to 20 nm. The first segment 75A has a substantially the same width as the diameter of the focused ion beam at the point of impact. A substantially the same width as used herein includes a width that is exactly the same as or within 10% of the focused ion beam diameter at the point of impact.

The focused ion beam has first ion dose, first beam energy and first beam dwell time. The dwell time comprises the time that the beam contacts a given unit area. The beam may be scanned along the first horizontal direction one or more times in the first segment. Thus, the dwell time is a function of at least the beam scanning speed and the number of passes (i.e., scans) in the segment. The energy of the focused ion beam may be in a range from 1 keV to 300 keV, such as from 5 keV to 50 keV, although lesser and greater ion beam energies can also be employed. The dose of the focused ion beam may be in a range from $1.0 \times 10^{12}$ atoms/cm$^2$ to $1.0 \times 10^{15}$ atoms/cm$^2$, although lesser and greater doses can also be employed. The atomic species of the ion beam may be any element that may be employed in a focused ion beam. For example, the atomic species of the ions in the focused ion beam may include, and/or may consist essentially of, helium or gallium.

The ions that impinge on the segment 75A of the ferroelectric gate dielectric layer 750L induce structural damage therein. Specifically, the focused ion beam irradiation processes results in at least one of a first density of broken bonds in the ferroelectric gate dielectric layer segment, a first density of displaced atoms in a crystal lattice of the ferroelectric gate dielectric layer segment, and/or a first density of gallium or helium atoms implanted into (i.e., implanted ion concentration) the ferroelectric gate dielectric layer segment.

Without wishing to be bound by a particular theory, it is believed that the broken bonds block domain walls in the scanned ferroelectric gate dielectric layer segment, which requires a higher applied voltage to switch the polarization state of the segment. The percentage shift in the applied voltage (e.g., coercive electrical field) depends on the degree of structural damage (i.e., density of broken bonds) in the ferroelectric material of the damaged segment.

The displaced atoms are displaced from their equilibrium positions to metastable positions in the crystal lattice that effectively retard change in the electrical dipole moment within the ferroelectric material. In other words, the ferroelectric gate dielectric layer 750L segment with displaced atoms does not lose its ferroelectric property, but the displacement of one or more atoms from the normal position within a unit cell structure of the crystal lattice retards switching of the direction of the electrical dipole moment by requiring buildup of more energy for switching of the direction of the electrical dipole moment. Thus, the hysteresis curve of the ferroelectric gate dielectric layer segment is modified from the hysteresis curve of the undamaged segment by increasing the magnitude of the applied voltage (e.g., coercive electrical field) that is needed to switch the direction of polarization of the segment. The percentage shift in the applied voltage (e.g., coercive electrical field) depends on the degree of structural damage (i.e., density of displaced atoms) in the ferroelectric material of the damaged segment.

Likewise, implantation of the helium or gallium atoms of the focused ion beam into the segment causes a disruption to the crystal lattice of the segment containing the helium or gallium atoms. This disruption causes an increase in the applied voltage (e.g., coercive electrical field) required to switch the polarization direction of the implanted segment. The percentage shift in the applied voltage (e.g., coercive electrical field) depends at least in part on the concentration of implanted helium or gallium ions (i.e., density of implanted atoms) in the ferroelectric material of the damaged segment.

Figures 18A, 18B:
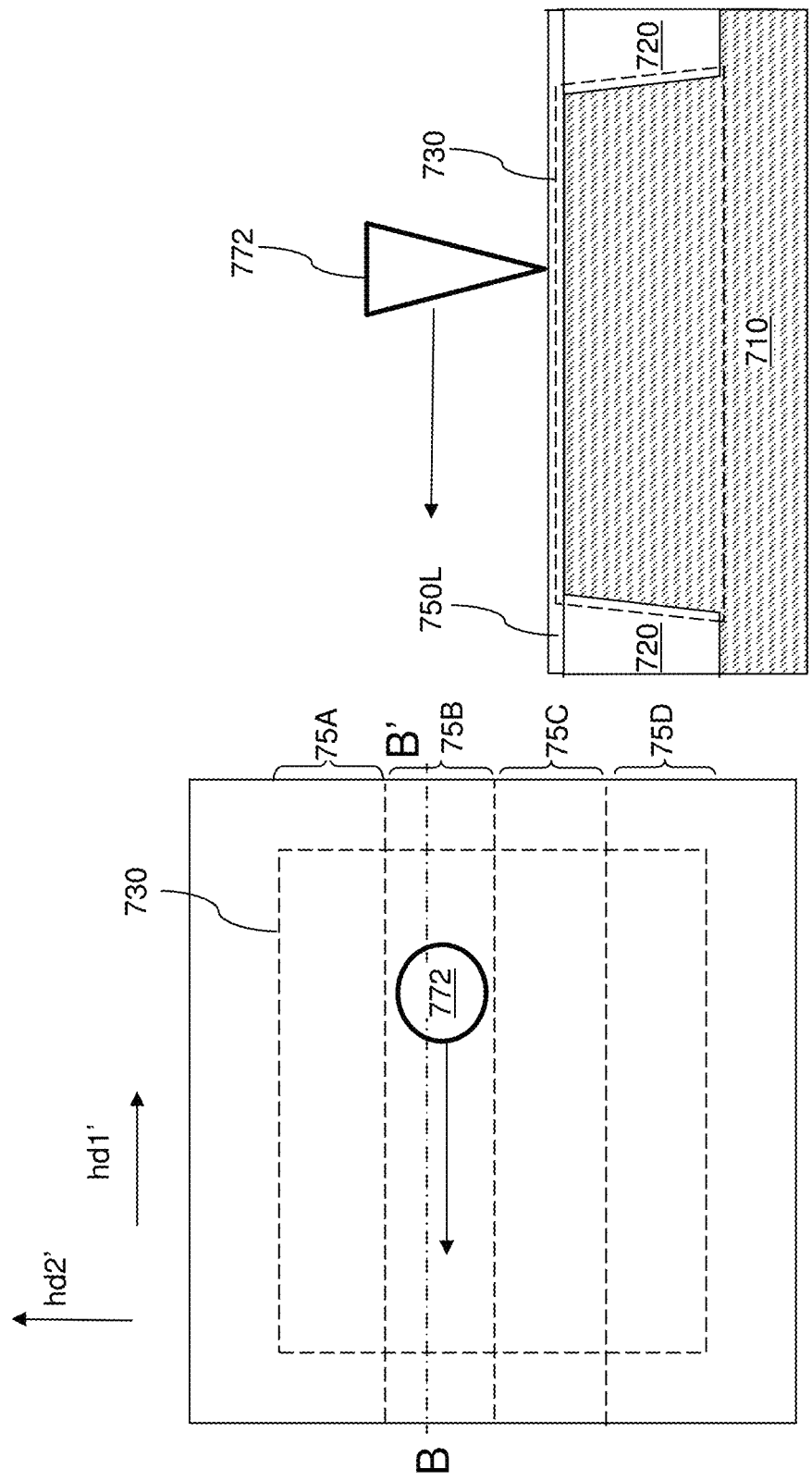
FIG. 18A is a top-down view of a fifth exemplary structure after a second masked ion implantation process according to the fifth embodiment of the present disclosure.
FIG. 18B is a vertical cross-sectional view along the vertical plane B-B' of FIG. 18A.

Referring to FIGS. 18A and 18B, a second focused ion beam is scanned over the second segment 75B of the ferroelectric gate dielectric layer 750L. The second focused ion beam has a second beam diameter at the point of impact on layer 750L, a second ion dose, a second beam energy and second beam dwell time.

In one embodiment, the second focused ion beam diameter at the point of impact on layer 750L is substantially the same as the width of the second segment 75B and is scanned only over the second segment 75B. In this embodiment, at least one of the second ion dose, the second beam energy, and/or the second beam dwell time is less than the respective first ion dose, first beam energy, and/or first beam dwell time.

In another embodiment, the second focused ion beam diameter at the point of impact on layer 750L is substantially the same as the width of the sum of the first segment 75A and the second segment 75B in the second horizontal direction hd2'. In this embodiment, the second focused ion beam is scanned over the first segment 75A and the second segment 75B at the same time. In this embodiment, the second ion dose, the second beam energy and/or the second beam dwell time may be the same as the respective first ion dose, second beam energy and/or first beam dwell time. The first segment 75A is scanned twice (i.e., by the first and second ion beams) while the second segment 75B is scanned once (i.e., only by the second ion beam).

In both of these embodiments, the first segment 75A has a higher density of structural defects than the second segment 75B. In other words, the first segment 75A has a higher density of broken bonds in the ferroelectric gate dielectric layer, a higher density of displaced atoms in a crystal lattice of the ferroelectric gate dielectric layer, and/or a higher density of gallium or helium atoms, than the second segment 75B.

Referring to FIGS. 19A and 19B, a third focused ion beam is scanned over the third segment 75C of the ferroelectric gate dielectric layer 750L. The third focused ion beam has a third beam diameter at the point of impact on layer 750L, a third ion dose, a third beam energy and third beam dwell time.

In one embodiment, the third focused ion beam diameter at the point of impact on layer 750L is substantially the same as the width of the third segment 75C and is scanned only over the third segment 75C. In this embodiment, at least one of the third ion dose, the third beam energy, and/or the third beam dwell time is less than the respective first or second ion dose, first or second beam energy, and/or first or second beam dwell time.

In another embodiment, the third focused ion beam diameter at the point of impact on layer 750L is substantially the same as the width of the sum of the first segment 75A, the second segment 75B, and the third segment 75C in the second horizontal direction hd2'. In this embodiment, the third focused ion beam is scanned over the first segment 75A, the second segment 75B and the third segment 75C at the same time. In this embodiment, the third ion dose, the third beam energy and/or the third beam dwell time may be the same as the respective first ion dose, second beam energy and/or first beam dwell time. The first segment 75A is scanned three times (i.e., by the first, second and third ions beams), the second segment 75B is scanned twice (i.e., by the second and third ion beams) while the third segment 75C is scanned once (i.e., only by the third ion beam).

In both of these embodiments, the first segment 75A has a higher density of structural defects than the second segment 75B, and the second segment 75B has a higher density of structural defects than the third segment 75C. In other words, the first and second segments 75A and 75B have a higher density of broken bonds in the ferroelectric gate dielectric layer, a higher density of displaced atoms in a crystal lattice of the ferroelectric gate dielectric layer, and/or a higher density of gallium or helium atoms, than the third segment 75C.

The fourth segment 75D may remain unscanned by any focused ion beam. Thus, the fourth segment has the lowest density of structural defects of any segment. In other words, the fourth segment 75D has a lower density of structural defects noted above than the first, second or third segments.

While four segments (75A, 75B, 75C, 75D) and three ion beams are described above, any number of two or more segments with different density of structural defects may be used. Furthermore, any suitable number of focused ions beams may be used to form the different density of structural defects in the respective segments. Finally, while a focused ion beam was described above, any other suitable method of forming structural defects in the segments may be used instead.

The implanted gallium or helium ions may pass through the ferroelectric gate dielectric layer 750L, may remain in the ferroelectric gate dielectric layer 750L and/or may be volatilized (for example, in case helium atoms are implanted). The various segments (75A, 75B, 75C, 75D) of the ferroelectric gate dielectric layer 750L can have a same material composition if they have the same helium or gallium concentration, or they may have a different composition if they have a different helium or gallium concentration. In one embodiment, the structural defect densities (e.g., density of broken bonds, displaced atoms and/or implanted atoms) in the various segments (75A, 75B, 75C, 75D) of the ferroelectric gate dielectric layer 750L can be in a range from $5.0 \times 10^{16}/cm^3$ to $5.0 \times 10^{21}/cm^3$, such as from $1.0 \times 10^{18}/cm^3$ to $2.5 \times 10^{21}/cm^3$, although lesser and greater defect densities can also be employed. The average displacement distance of displaced atoms (which provide the structural defects) can be in a range from 0.01 nm to 0.1 nm, although lesser and greater average displacement distances can also be employed.

Referring to FIGS. 20A-20D, hysteresis curves for the electrical polarization P of different segments of the ferroelectric gate dielectric layer 750L are schematically illustrated as a function of external electrical field E (which is a function of the applied voltage). FIG. 20A corresponds to the hysteresis curve for the first segment 75A of the ferroelectric gate dielectric layer 750L in FIGS. 19A and 19B. FIG. 20B corresponds to the hysteresis curve for the second segment 75B of the ferroelectric gate dielectric layer 750L in FIGS. 19A and 19B. FIG. 20C corresponds to the hysteresis curve for the third segment 75C of the ferroelectric gate dielectric layer 750L in FIGS. 19A and 19B. FIG. 20D corresponds to the hysteresis curve for the fourth segment 75D of the ferroelectric gate dielectric layer 750L in FIGS. 19A and 19B, which can be the same as the hysteresis curve of the material of the ferroelectric gate dielectric layer 750L as formed at the processing steps of FIGS. 16A and 16B prior to any focused ion beam scans. Generally, the greater the density of structural defects in a respective segment of the ferroelectric gate dielectric layer 750L, the higher the coercive field for the respective segment of the ferroelectric gate dielectric layer 750L.

Referring to FIGS. 21A and 21B, further processing steps can be performed on the structure of FIGS. 19A and 19B to form a gate electrode. At least one gate electrode material layer can be subsequently deposited over the ferroelectric gate dielectric layer 750L. The at least one gate electrode material layer includes at least one conductive material. For example, the at least one gate electrode material layer can include at least one of a metal, an intermetallic alloy, a metal-semiconductor alloy, a conductive metal oxide, a conductive metal nitride, a conductive metal carbide, and a doped semiconductor material including p-type dopants or n-type dopants at an average atomic concentration in a range from $5.0 \times 10^{19}/cm^3$ to $2.0 \times 10^{21}/cm^3$. The at least one gate electrode material layer can be composed of a single conductive material or a stack of multiple conductive materials. The bottommost material within the at least one gate electrode material layer can be selected to provide a suitable work function for the gate electrodes to be subsequently formed by patterning the at least one gate electrode material layer. The at least one gate electrode material layer can be formed by chemical vapor deposition, physical vapor deposition, vacuum evaporation, and/or atomic layer deposition. The thickness of the at least one gate electrode material layer can be in a range from 50 nm to 300 nm, although lesser and greater thicknesses can also be employed.

A gate cap dielectric layer can be optionally formed over the gate electrode material layer. The gate cap dielectric layer includes a diffusion barrier material such as silicon nitride. The thickness of the gate cap dielectric layer can be in a range from 20 nm to 60 nm, although lesser and greater thicknesses can also be employed.

A photoresist layer (not shown) can be applied over the gate cap dielectric layer, and can be lithographically patterned to form line patterns that extend over a respective one of the device regions. An anisotropic etch process (such as a reaction ion etch process) can be performed to transfer the pattern in the photoresist layer through the layer stack of the gate cap dielectric layer and the at least one gate electrode material layer, and optionally through the ferroelectric gate dielectric layer 750L. The ferroelectric gate dielectric layer 750L or the semiconductor material layer 710 may be employed as etch stop structures. Each patterned portion of the gate cap dielectric layer comprises a gate cap dielectric (e.g., silicon oxide or nitride) 758, and each patterned portion of the at least one gate electrode material layer comprise a gate electrode (752, 754). In one embodiment, each gate electrode (752, 754) may include a first gate electrode portion 752 including a first gate electrode material (e.g., metal) and a second gate electrode portion 754 including a second gate electrode material (e.g., polysilicon). In one embodiment, each gate electrode (752, 754) can overlie each of the plurality of ferroelectric gate dielectric portions (i.e., segments 75A, 75B, 75C, 75D) of the ferroelectric gate dielectric layer 750L.

An extension ion implantation process can be performed to implant dopants of a second conductivity type into unmasked surface portions of the semiconductor material layer 710. The second conductivity type is the opposite of the first conductivity type. For example, if the first conductivity type is p-type, the second conductivity type is n-type, and vice versa. The implanted surface portions of the semiconductor material layer 710 are converted into doped semiconductor regions having a doping of the second conductivity type. A source extension region 731 and a drain extension region 733 (also referred to as LDD regions) can be formed within each device region for forming a field effect transistor by conversion of the surface portions of the semiconductor material layer 710 into doped semiconductor material portions having a doping of the second conductivity type. The average atomic concentration of dopants of the second conductivity type in the source extension regions 731 and the drain extension regions 733 can be in a range from $1.0 \times 10^{17}/cm^3$ to $1.0 \times 10^{20}/cm^3$, although lesser and greater dopant concentrations can also be employed. The depth of the source extension regions 731 and the drain extension regions 733 can be in a range from 10 nm to 100 nm, although lesser and greater depths can also be employed. Each surface portion of the semiconductor material layer 710 that underlies a gate electrode (752, 754) and is located between a neighboring pair of a source extension region 731 and a drain extension region 733 comprises a semiconductor channel 35. Each semiconductor channel 35 extends between a source extension region 731 and a drain extension region 733, and has a doping of the first conductivity type. Optionally, a halo implantation can be performed to implant dopants of the first conductivity type into regions that underlie the gate electrodes (752, 754).

Referring to FIGS. 22A and 22B, at least one dielectric material such as silicon nitride and/or silicon oxide can be conformally deposited over the gate cap dielectrics 758, the source extension regions 731, the drain extension regions 733, and the shallow trench isolation structures 720. The at least one dielectric material can be anisotropic etched (for example, by a reactive ion sidewall spacer etch process) to remove horizontal portions. Each remaining vertical portion that laterally surrounds a respective stack of a gate electrode (752, 754) and a gate cap dielectric 758 comprises a gate spacer (i.e., sidewall spacer) 756, which includes the at least one dielectric material. While only a single gate spacer 756 is illustrated in FIGS. 22A and 22B, embodiments are expressly contemplated herein in which multiple gate spacers are formed around each stack of a gate electrode (752, 754) and a gate cap dielectric 758 by sequentially depositing and anisotropically etching multiple dielectric material layers.

The anisotropic etch process may also etch unmasked portions of the ferroelectric gate dielectric layer 750L. Each remaining patterned portion of the ferroelectric gate dielectric layer 750L comprises a ferroelectric gate dielectric 750. In this case, sidewalls of each ferroelectric gate dielectric 750 may be vertically coincident with outer sidewalls of a respective one of the gate spacers 756. In one embodiment, a gate spacer 756 can laterally surround a respective stack of a gate electrode (752, 754) and a gate cap dielectric 758. The width of each gate spacer 756 at the base portion (i.e., the lateral distance between an inner sidewall and an outer sidewall) can be in a range from 20 nm to 100 nm, although lesser and greater widths can also be employed. Each contiguous assembly of a ferroelectric gate dielectric 750, a gate electrode (752, 754), an optional gate cap dielectric 758, and an optional gate spacer 756 comprises a gate stack structure (750, 752, 754, 758, 756).

Dopants of the second conductivity type can be implanted into unmasked portions of the source extension regions 731, the drain extension regions 733, and underlying regions of the semiconductor material layer 710. Implanted portions of the source extension regions 731, the drain extension regions 733, and the semiconductor material layer 710 form deep source regions 732 and deep drain regions 734. The average atomic concentration of dopants of the second conductivity type in the deep source regions 732 and the deep drain regions 734 can be in a range from $5.0 \times 10^{18}/cm^3$ to $2.0 \times 10^{21}/cm^3$, although lesser and greater dopant concentrations can also be employed. The average atomic concentration of dopants of the second conductivity type in the deep source regions 732 and the deep drain regions 734 is higher than the average atomic concentration of dopants of the second conductivity type in the remaining portions of the source extension regions 731 and the drain extension regions 733. The depth of the deep source regions 732 and the deep drain regions 734 can be in a range from 40 nm to 300 nm, although lesser and greater depths can also be employed. The depth of the deep source regions 732 and the deep drain regions 734 can be greater than the depth of the remaining portions of the source extension regions 731 and the drain extension regions 733. A deep source region 732 and a deep drain region 734 can be formed within each device region 730.

Each contiguous combination of a source extension region 731 and a deep source region 732 constitutes a source region (731, 732). Each contiguous combination of a drain extension region 733 and a deep drain region 734 constitutes a drain region (733, 734). Generally, a source region (731, 732) and a drain region (733, 734) can be formed in the semiconductor material of the semiconductor material layer 710 within each device region that is laterally surrounded by a shallow trench isolation structure 720. A semiconductor channel 35 extends in the first horizontal direction hd1' between the source region (731, 732) and the drain region (733, 734) underneath a stack of a gate electrode (752, 754) and a gate cap dielectric 758. Generally, a source region (731, 732) and a drain region (733, 734) can be formed within, or on, the semiconductor material layer 710. The source region (731, 732) and the drain region (733, 734) can be laterally spaced apart from each other by a channel region 35 in the semiconductor material layer 710.

Figures 23A, 23B:
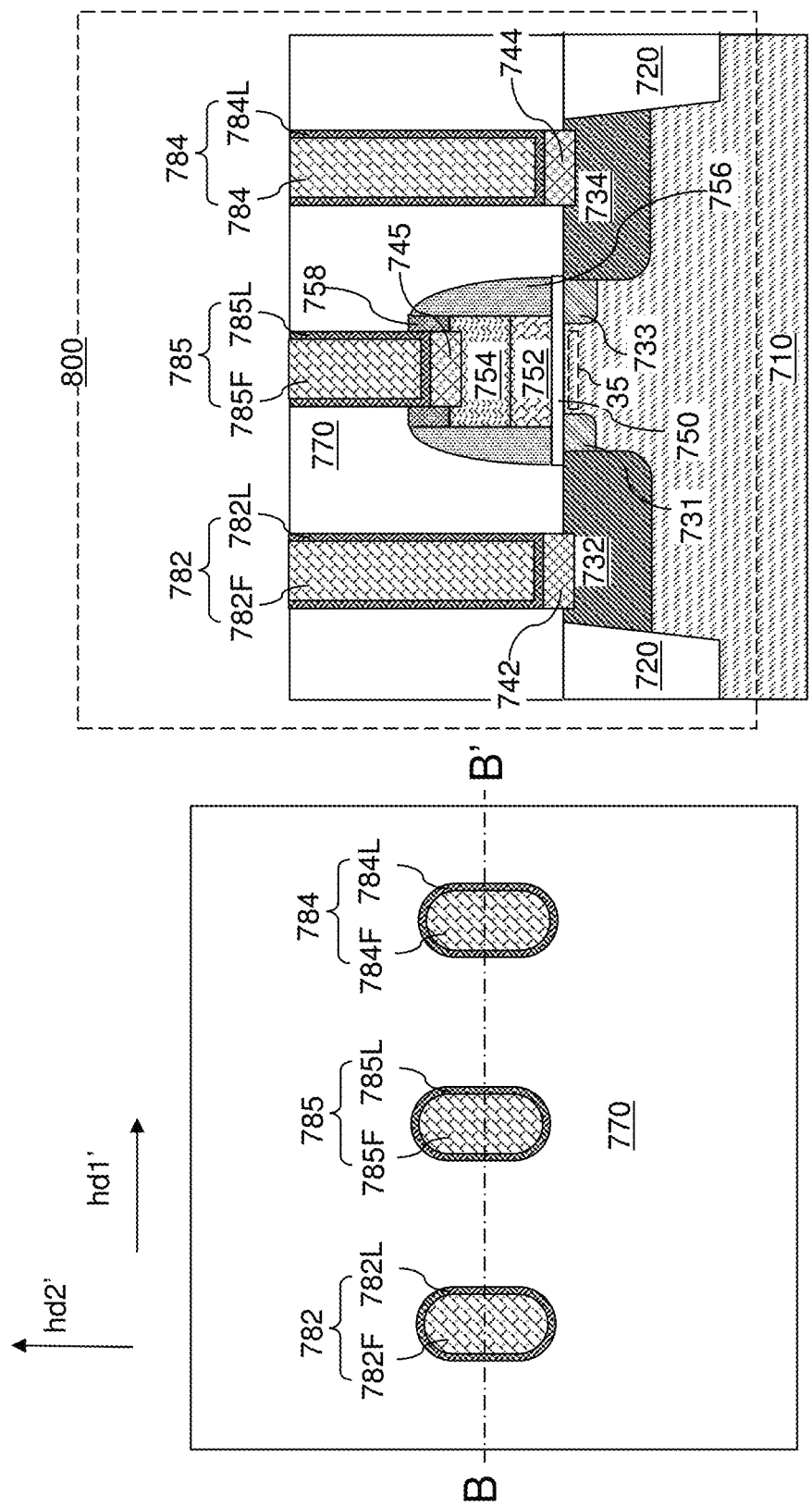
FIG. 23A is a top-down view of a fifth exemplary structure after formation of a contact-level dielectric layer and contact via structures according to the fifth embodiment of the present disclosure.
FIG. 23B is a vertical cross-sectional view along the vertical plane B-B' of FIG. 23A.

Referring to FIGS. 23A and 23B, a dielectric material can be deposited over the gate stack structures (750, 752, 754, 758, 756), the source regions (731, 732), the drain regions (733, 734), and the shallow trench isolation structures 720. The dielectric material can include a planarizable dielectric material such as undoped silicate glass or a doped silicate glass, or a self-planarizing dielectric material such as flowable oxide (FOX). The dielectric material can be deposited by a chemical vapor deposition process (such as a plasma-enhanced chemical vapor deposition process) or by spin coating. The top surface of the dielectric material can be planarized during, or after, the deposition process. A dielectric material layer having a planar (i.e., horizontal) top surface is formed, through which contact via structures are subsequently formed. As such, the dielectric material layer is herein referred to as a contact-level dielectric layer 770.

The top surface of the contact-level dielectric layer 770 can be planar, and can be located above the top surface of the gate cap dielectrics 758. The vertical distance between the top surface of the contact-level dielectric layer 770 and the top surfaces of the gate cap dielectrics 758 can be in a range from 30 nm to 7400 nm, although lesser and greater thicknesses can also be employed.

A photoresist layer (not shown) can be applied over the contact-level dielectric layer 770, and can be lithographically patterned to form discrete openings therethrough. The openings in the photoresist layer can be formed over the source regions (731, 732), the drain regions (733, 734), and the gate electrodes (752, 754). An anisotropic etch process can be performed to form contact via cavities through the contact-level dielectric layer 770. The contact via cavities include source contact via cavities that extend from the top surface of the contact-level dielectric layer 770 to a top surface of a respective one of the source regions (731, 732), drain contact via cavities that extend from the top surface of the contact-level dielectric layer 770 to a top surface of a respective one of the drain regions (733, 734), and gate contact via cavities that extend from the top surface of the contact-level dielectric layer 770 to a top surface of a respective one of the gate electrodes (752, 754).

A metal that can form a metal-semiconductor alloy can be deposited into the contact via cavities by a conformal or non-conformal deposition method. If the semiconductor material layer 710 comprises, and/or consists essentially of, doped silicon, the metal can be a material that can form a metal silicide. For example, the metal can include nickel, titanium, tungsten, molybdenum, platinum, or another metal that forms a metal silicide. An anneal process is performed at an elevated temperature to induce formation of a metal silicide material. The elevated temperature can be in a range from 500 degrees Celsius to 750 degrees Celsius. Unreacted portions of the metal can be removed by a wet etch process that etches the metal selective to the metal silicide material. Remaining portions of the metal silicide material include source-side metal-semiconductor alloy regions 742 contacting a respective source region (731, 732), drain-side metal-semiconductor alloy regions 744 contacting a respective drain region (733, 734), and gate-side metal-semiconductor alloy regions 745 contacting a respective gate electrode 754 (in case the topmost material of the gate electrodes (752, 754) prior to the anneal process includes silicon).

A metallic liner including diffusion barrier material can be deposited at peripheral portions of the remaining volumes of the contact via cavities. The metallic liner includes a conducive metallic nitride material (such as TiN, TaN, or WN) and/or a metallic carbide material (such as TiC, TaC, or WC). The thickness of the metallic liner can be in a range from 3 nm to 15 nm, although lesser and greater thicknesses can also be employed.

A metallic fill material such as Cu, W, Mo, Co, Ru, and/or another elemental metal or an intermetallic alloy can be deposited in remaining volumes of the contact via cavities. Portions of the metallic fill material and the metallic liner located above the horizontal plane including the top surface of the contact-level dielectric layer 770 can be removed by a planarization process. Each contiguous combination of a remaining portion of the metallic fill material and the metallic liner that fills a respective one of the contact via cavities constitutes a contact via structure (782, 784, 785). The contact via structures (782, 784, 785) include source contact via structures 782 contacting a respective source-side metal-semiconductor alloy region 742, drain contact via structures 784 contacting a respective drain-side metal-semiconductor alloy region 744, and gate contact via structures 785 contacting a respective gate-side metal-semiconductor alloy region 745 or a respective gate electrode 754 (in case gate-side metal-semiconductor alloy regions 745 are not formed). Each source contact via structure 782 includes a source-side metallic liner 782L and a source-side metallic fill material portion 782F. Each drain contact via structure 784 includes a drain-side metallic liner 784L and a drain-side metallic fill material portion 784F. Each gate contact via structure 785 includes a gate-side metallic liner 785L and a gate-side metallic fill material portion 785F. A field effect transistor 800 having multiple turn on voltages for the various segments (75A, 75B, 75C, 75D) of the ferroelectric gate dielectric 750 is provided.

Figure 24:
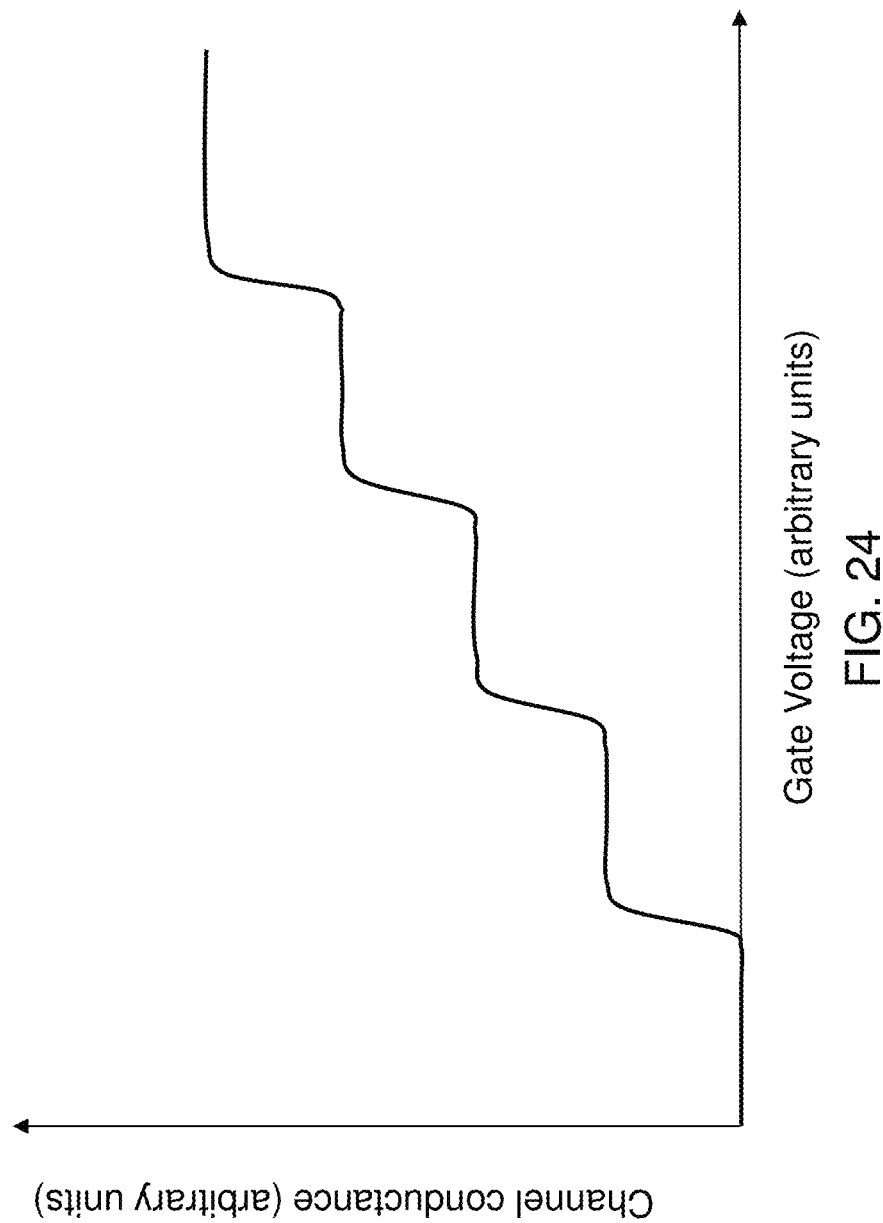
FIG. 24 is the channel conductance of the field effect transistor in the fifth exemplary structure as a function of a gate voltage according to the fifth embodiment of the present disclosure.

Referring to FIG. 24, an exemplary channel conductance for the field effect transistor 800 of the fifth embodiment of the present disclosure is illustrated. The different coercive fields of the segments (75A, 75B, 75C, 75D) of the ferroelectric gate dielectric 750 induce multiple turn-on voltages for the different portions of the channel region 35 that underlies a respective one of the different segments (75A, 75B, 75C, 75D) of the ferroelectric gate dielectric 750. In other words, each portion of the channel region 35 that underlies a respective segment (75A, 75B, 75C, 75D) of the ferroelectric gate dielectric 750 has a respective turn-on voltage that is different from other turn on voltage. In the illustrated example of FIG. 24, the first conductivity type can be p-type and the minority charge carrier in the channel region 35 can be electrons.

If the transistor 800 is a ferroelectric memory device (i.e., memory transistor), then a ferroelectric memory array may be provided, which can include an array of the ferroelectric memory devices 800 illustrated in FIGS. 23A and 23B. The array may comprise a NOR type array. Each ferroelectric memory device (i.e., transistor) 800 may comprise a multi-level memory cell of the array.

The ferroelectric gate dielectric 750 of each device (i.e., transistor) 800 can be programmed such that the electrical dipole moment within the ferroelectric gate dielectric 750 points upward so that electrons (i.e., the minority charge carriers) are repelled from the channel region 35 prior to application of the gate voltage. As the gate voltage increases, the electrical dipole moment of a region of the ferroelectric gate dielectric 750 that has the lowest coercive field (such as the fourth segment 75D) can flip at a first turn-on voltage, and the channel conductance can increase stepwise with an accompanying increase in the source-drain current. As the gate voltage increases further, the electrical dipole moment of another region of the ferroelectric gate dielectric 750 that has the second lowest coercive field (such as the third segment 75C) can flip at a second turn-on voltage, and the channel conductance can increase stepwise with an accompanying increase in the source-drain current. As the gate voltage increases further, the electrical dipole moment of yet another region of the ferroelectric gate dielectric 750 that has the next high coercive field (such as the second segment 75B) can flip at a third turn-on voltage, and the channel conductance can increase stepwise with an accompanying increase in the source-drain current. As the gate voltage increases even further, the electrical dipole moment of the region of the ferroelectric gate dielectric 750 that has the highest coercive field (such as the first segment 75A) can flip at a last (such as fourth) turn-on voltage, and the channel conductance can increase stepwise with an accompanying increase in the source-drain current.

The threshold voltage of the field effect transistor 800 can be defined as the lowest turn-on voltage of the multiple turn-on voltages for the different portions of the channel region 35 that underlie a respective portion (i.e., segment) of the ferroelectric gate dielectric 750. For example, the threshold voltage of the field effect transistor 800 can be the turn-on voltage for the portion of the channel region 35 that underlies the fourth segment 75D of the ferroelectric gate dielectric 750. Generally, the conductance of the channel region 35 under a gate bias voltage that is greater than the threshold voltage of the field effect transistor (such as a voltage that is 0.1 V higher than the threshold voltage) can be a function of hysteresis of a voltage applied to the gate electrode (752, 754), and can include at least two different conductance values.

Figure 25:
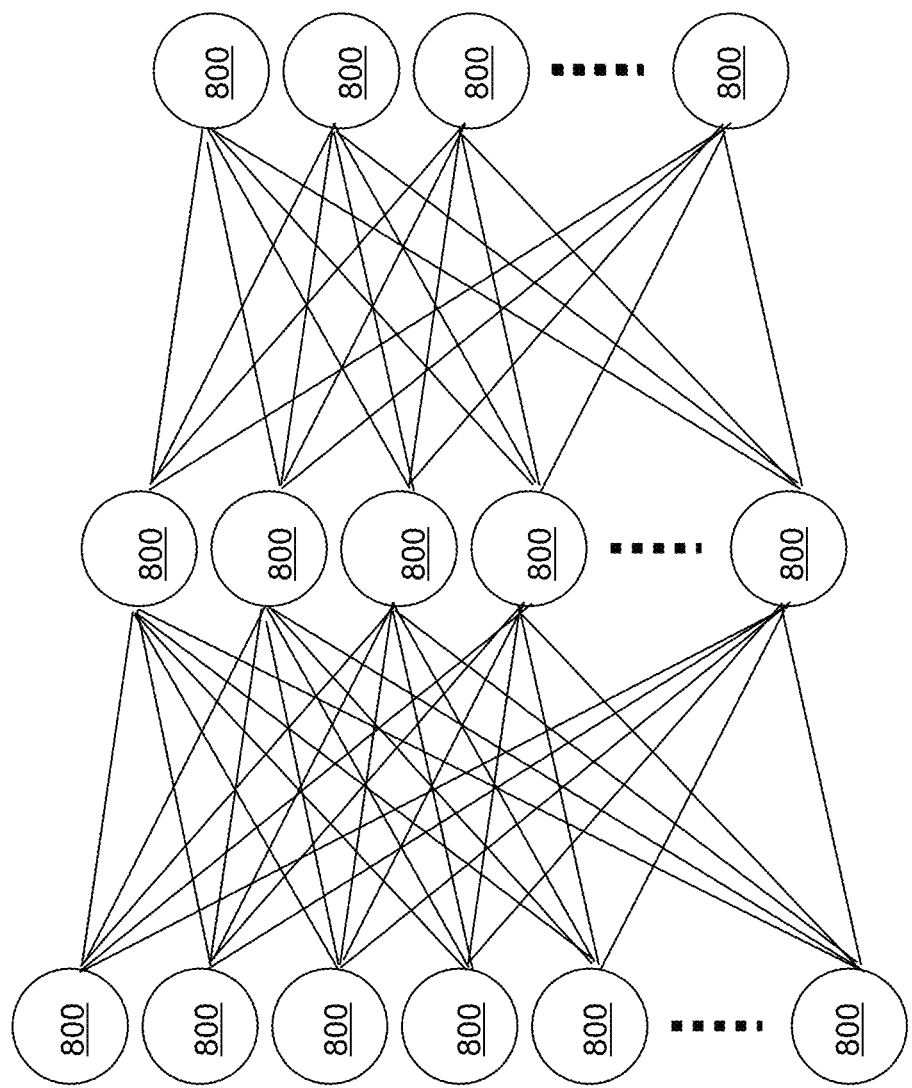
FIG. 25 is an interconnected network of ferroelectric memory devices that are connected in a synaptic connection configuration according to the fifth embodiment of the present disclosure.

Referring to FIG. 25, in another embodiment, an interconnected network of transistors 800 is illustrated. Each of the transistors 800 is a respective field effect transistor 800 illustrated in FIGS. 23A and 23B. The transistors may be connected in a synaptic connection configuration in which output nodes of one group of transistors are connected to a respective set of multiple input nodes of another group of ferroelectric memory devices. The average number of connections per output node of each transistor may be at least three, and may be four or more. The connections within the synaptic connection configurations may be confined within physical proximity of each transistor. For example, the electrical connection may be limited up to second, third or fourth nearest neighbor transistor, or any other predetermined level of physical proximity. Such synaptic connection configuration can be advantageously employed to provide a computing device in which multiple possibilities are simultaneously calculated, and probabilistic answers to a given question are provided. The conductance of each path can increase within an increase of respective control voltage in such a synaptic connection configuration.

Referring to FIGS. 15A-25 and related drawings and according to the fifth embodiment of the present disclosure, a ferroelectric device 800 comprises a semiconductor channel region 35, a gate electrode (752, 754), and a ferroelectric gate dielectric 750 located between the channel region and the gate electrode, and including a plurality of ferroelectric gate dielectric portions (75A-75D) having different structural defect densities.

In one embodiment, the device 800 is a transistor further comprising a source region (731, 732) and a drain region (733, 734), where the channel region 35 is located between the source region and the drain region. In one embodiment, the plurality of ferroelectric gate dielectric portions (75A-75D) have the same thickness. In one embodiment, each of the plurality of ferroelectric gate dielectric portions (75A-75D) comprises a ferroelectric dielectric transition metal oxide material (such as hafnium oxide doped with Zr, Al or Si, or any of the other ferroelectric materials described above). In one embodiment, the channel region 35 comprises a silicon (e.g., polysilicon or single crystal silicon) channel region, a metal oxide (e.g., ZnO) semiconductor channel region, an organic semiconductor channel region or a two-dimensional metal dichalcogenide (e.g., $MoS_2$) semiconductor channel region.

In one embodiment, each boundary between a neighboring pair of ferroelectric gate dielectric portions (e.g., a boundary between adjacent segments 75A and 75B, etc.) of the plurality of ferroelectric gate dielectric portions extends between the gate electrode (752, 754) and the channel region 35 in the first horizontal direction hd1' and is parallel to a straight line connecting a geometrical center of the source region (731, 732) to a geometrical center of the drain region (733, 734). In one embodiment, the plurality of ferroelectric gate dielectric portions (75A-75D) comprises three or more ferroelectric gate dielectric portions. The structural defect density may differ by at least 10%, such as by 20% to 200% between different portions (e.g., segments 75A-75D). For example, the defect density in the first segment 75A may be at least 10% higher than in the second segment 75B, etc. In one embodiment, the structural defect densities are in a range from $5.0 \times 10^{16}/cm^3$ to $5.0 \times 10^{21}/cm^3$.

In one embodiment, the different structural defect densities comprise a different density of broken bonds in the different ferroelectric gate dielectric portions. In another embodiment, the different structural defect densities comprise a different density of displaced atoms in a crystal lattice in the different ferroelectric gate dielectric portions. In another embodiment, the different structural defect densities comprise a different density of gallium or helium atoms in the different ferroelectric gate dielectric portions. In one embodiment, the ferroelectric gate dielectric 750 contacts the channel region 35, and different portions of the channel region 35 which contact the respective different ferroelectric gate dielectric portions 75A-75D have different conductance values.

In one embodiment, a ferroelectric memory array comprises a plurality of the ferroelectric devices 80 described above. In another embodiment shown in FIG. 25, an interconnected network of the ferroelectric devices described above are connected in a synaptic connection configuration in which a conductance of each path increases with an increase of a respective control voltage.

The various embodiments of the present disclosure provide various ferroelectric semiconductor devices, which may be employed as memory, logic or sensor devices. The configurations of the devices of the present disclosure can provide various advantages, which can include, but are not limited to, multiple turn-on voltages and/or multiple memory states (which comprise different polarization states of multiple segments of a ferroelectric gate dielectric 750).

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A ferroelectric device, comprising:
    a semiconductor channel region;
    a gate electrode; and
    a ferroelectric gate dielectric located between the channel region and the gate electrode, and including a plurality of ferroelectric gate dielectric portions having different structural defect densities.

2. The ferroelectric device of claim 1, further comprising a source region and a drain region, wherein the channel region is located between the source region and the drain region.

3. The ferroelectric device of claim 2, wherein the plurality of ferroelectric gate dielectric portions have the same thickness.

4. The ferroelectric device of claim 3, wherein each of the plurality of ferroelectric gate dielectric portions comprises a ferroelectric dielectric transition metal oxide material selected from hafnium oxide containing at least one dopant selected from Al, Zr, and Si and having a ferroelectric non-centrosymmetric orthorhombic phase, zirconium oxide, hafnium-zirconium oxide, barium titanate, colemanite, bismuth titanate, europium barium titanate, ferroelectric polymer, germanium telluride, langbeinite, lead scandium tantalate, lead titanate, lead zirconate titanate, lithium niobate, $LaAlO_3$, polyvinylidene fluoride, potassium niobate, potassium sodium tartrate, potassium titanyl phosphate, sodium bismuth titanate, lithium tantalate, lead lanthanum titanate, lead lanthanum zirconate titanate, ammonium dihydrogen phosphate, or potassium dihydrogen phosphate.

5. The ferroelectric device of claim 4, wherein the channel region comprises a silicon channel region, a metal oxide semiconductor channel region, an organic semiconductor channel region or a two-dimensional metal dichalcogenide semiconductor channel region.

6. The ferroelectric device of claim 2, wherein each boundary between a neighboring pair of ferroelectric gate dielectric portions of the plurality of ferroelectric gate dielectric portions extends between the gate electrode and the channel region and is parallel to a straight line connecting a geometrical center of the source region to a geometrical center of the drain region.

7. The ferroelectric device of claim 1, wherein the plurality of ferroelectric gate dielectric portions comprises three or more ferroelectric gate dielectric portions.

8. The ferroelectric device of claim 1, wherein structural defect densities are in a range from $5.0 \times 10^{16}/cm^3$ to $5.0 \times 10^{21}/cm^3$.

9. The ferroelectric device of claim 1, wherein the different structural defect densities comprise a different density of broken bonds in the different ferroelectric gate dielectric portions.

10. The ferroelectric device of claim 1, wherein the different structural defect densities comprise a different density of displaced atoms in a crystal lattice in the different ferroelectric gate dielectric portions.

11. The ferroelectric device of claim 1, wherein the different structural defect densities comprise a different density of gallium or helium atoms implanted into the different ferroelectric gate dielectric portions.

12. The ferroelectric device of claim 1, wherein the ferroelectric gate dielectric contacts the channel region, and wherein different portions of the channel region which contact the respective different ferroelectric gate dielectric portions have different conductance values.

13. A ferroelectric memory array comprising a plurality of the ferroelectric devices of claim 1.

14. An interconnected network of the ferroelectric devices, comprising a plurality of the ferroelectric devices of claim 1 that are connected in a synaptic connection configuration in which a conductance of each path increases with an increase of a respective control voltage.

15. A method of forming a ferroelectric device, comprising:
forming a source region and a drain region that are laterally spaced apart from each other by a channel region;
forming a ferroelectric gate dielectric over the channel region;
forming different structural defects in the ferroelectric gate dielectric, wherein a plurality of ferroelectric gate dielectric portions have different structural defect densities; and
forming a gate electrode over each of the plurality of ferroelectric gate dielectric portions.

16. The method of claim 15, wherein forming the ferroelectric gate dielectric comprises:
forming a ferroelectric gate dielectric layer; and
performing a different focused ion beam irradiation process in each of the plurality of ferroelectric gate dielectric portions to provide different structural defect densities in each of the plurality of ferroelectric gate dielectric portions.

17. The method of claim 16, wherein the different focused ion beam irradiation processes result in at least one of a different density of broken bonds in different ferroelectric gate dielectric portions, a different density of displaced atoms in a crystal lattice in the different ferroelectric gate dielectric portions, or different density of gallium or helium atoms in the different ferroelectric gate dielectric portions.

18. The method of claim 17, wherein the different focused ion beam irradiation processes use at least one of ion dose, beam energy or beam dwell time that are different from each other.

19. The method of claim 15, wherein:
the channel region is located between the source region and the drain region;
each boundary between a neighboring pair of ferroelectric gate dielectric portions of the plurality of ferroelectric gate dielectric portions extends between the gate electrode and the channel region and is parallel to a straight line connecting a geometrical center of the source region to a geometrical center of the drain region; and
the different focused ion beam irradiation process comprise scanning a focused ion beam along the straight line.

* * * * *